United States Patent [19]

Sakata et al.

[11] Patent Number: 5,309,393
[45] Date of Patent: May 3, 1994

[54] SEMICONDUCTOR MEMORY DEVICE

[75] Inventors: Takeshi Sakata, Kunitachi; Katsutaka Kimura, Akishima; Kiyoo Itoh, Higashikurume, all of Japan

[73] Assignee: Hitachi, Ltd., Tokyo, Japan

[21] Appl. No.: 774,834

[22] Filed: Oct. 11, 1991

[30] Foreign Application Priority Data

Oct. 11, 1990 [JP] Japan .................................. 2-270398

[51] Int. Cl.$^5$ ............................................. G11C 11/24
[52] U.S. Cl. ................................ 365/189.01; 365/210; 365/189.12; 365/230.03
[58] Field of Search ............... 365/174, 149, 182, 221, 365/240, 189.12, 145, 102, 45, 189.01, 210, 230.03

[56] References Cited

U.S. PATENT DOCUMENTS

| | | | |
|---|---|---|---|
| 4,648,073 | 3/1987 | Kenney | 365/184 |
| 4,648,074 | 3/1987 | Pollachek | 365/184 |
| 4,717,261 | 1/1988 | Kita et al. | 365/45 |
| 4,939,690 | 7/1990 | Modomi et al. | 365/185 |
| 4,996,669 | 2/1991 | Endoh et al. | 365/185 |

Primary Examiner—Eugene R. LaRoche
Assistant Examiner—Vu Le
Attorney, Agent, or Firm—Antonelli, Terry, Stout & Kraus

[57] ABSTRACT

A semiconductor memory device of the invention realizes a reduced memory array area decreasing the number of connection holes between data-lines and memory cells. The memory cell is made up of one transistor and one capacitor. The plurality of memory cells are connected in such a way that the transisters are connected in series to one another. The individual electrodes of the capacitors are connected to the respective connection of the transistors. By applying a voltage to the word-lines in order, the information stored as charge in respective capacitors is read out to the data-line.

42 Claims, 30 Drawing Sheets

F I G. 1
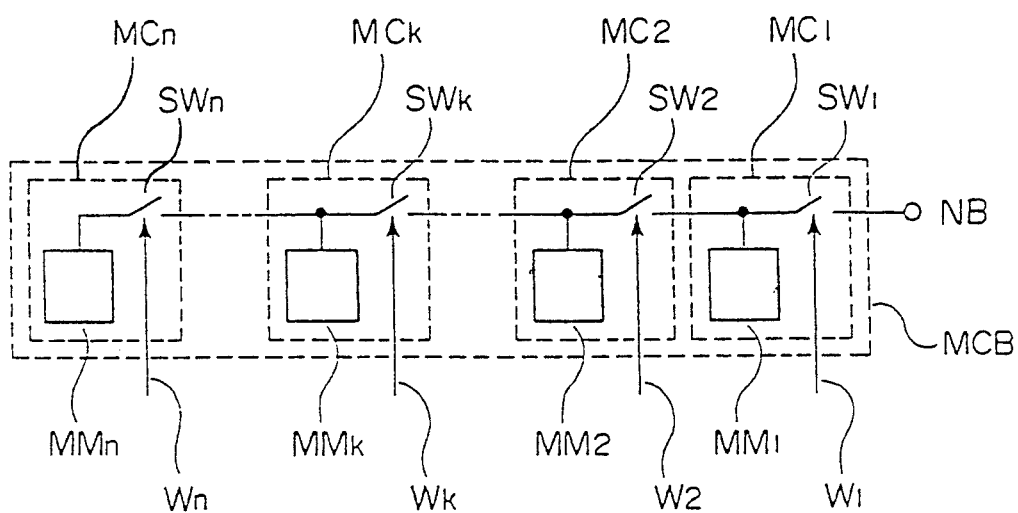

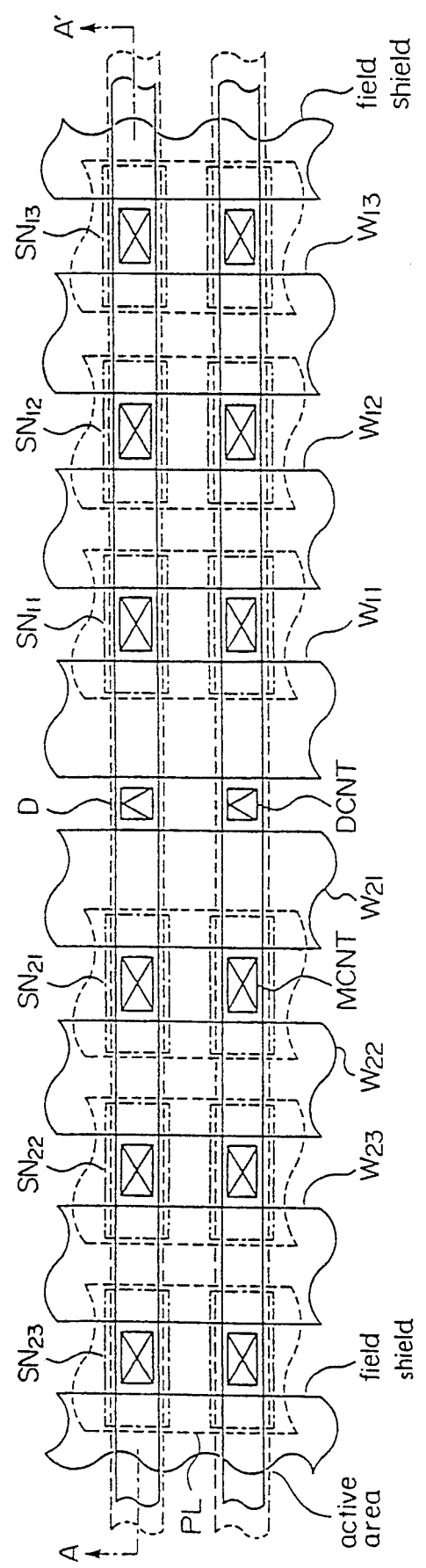

$W_1$    Vcc+α

$W_{n-1}$    Vcc+α

$W_n$

D    Vp

φR
φW    0V

NDS
DNDS

φL    Vcc

WR₁    Vcc+α / 0V

WR₂    0V

WRn    0V

φSAW    Vcc+α — φDR
φDR    0V — φSAW

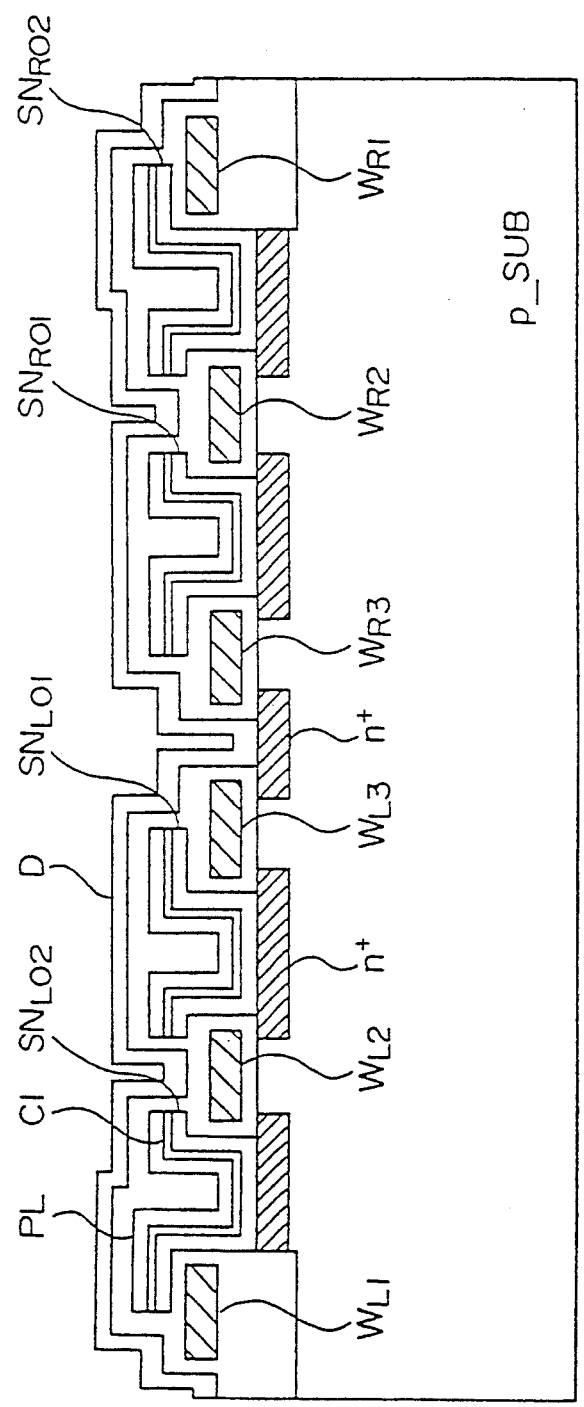

SEMICONDUCTOR MEMORY DEVICE

CROSS-REFERENCE TO RELATED APPLICATION

This application relates to U.S. Ser. No. 07/775001 entitled "Semiconductor Memory" being filed by Katsutaka Kimura, et al. and assigned to the present assignee, based on Japanese Patent Application No. 2-276293 and No. 2-322967 filed by the present assignee and the contents of which are incorporated herein by reference.

BACKGROUND OF THE INVENTION

The present invention relates to a semiconductor memory device and more particularly to a device having a large capacity and low cost.

A dynamic random-access memory (DRAM) is a typical semiconductor memory device of a large capacity. In the past, a typical DRAM has been arranged, in such a way that as shown in FIG. 2, a plurality of wordlines W are disposed in parallel with one another, a plurality of data-lines D are disposed so as to cross the wordlines W, and a memory cell MC is disposed at each of desired positions at intersections of the word-lines W and the data-lines D. One memory cell MC is generally made up of one storage capacitor Cs as storage means, and one MOS (metal oxide semiconductor) transistor M as a switch. Information of one binary digit (one bit) is stored in the form of the quantity of electric charge accumulated in the storage capacitor Cs. Moreover, each of the memory cells is connected to the associated dataline by the MOS transistor M, and a signal is transferred between the storage capacitor in each of the memory cells and the data-line, through the MOS transistor M.

The reading operation is carried out in the following manner. The data-line is precharged at a certain potential in a stand-by state, and the data-line is turned to a floating state, then the MOS transistor M is turned ON by the word-line. The electric charge accumulated in the storage capacitor Cs is re-allocated between a stray capacitance Cd of the data-line D and the capacitor Cs so that the potential at the data-line D is changed. It is judged whether the level of the signal on the data-line is "1" or "0" by sense means (not shown) connected to the data-line D. Normally, means for restoring the information destructively read out from the memory cell is provided in the data-line to make the potential level of the data-line go to a high potential corresponding to "1" or a low potential corresponding to "0" in accordance with the judgement result by the sense means. By reducing the potential at the word-line W, the electric charge corresponding to that potential is accumulated in the storage capacitor Cs. The sense means may perform the function of that restore means substitutely in some cases. Moreover, the writing operation can be performed in the same manner as in the restore operation by making the data-line go to the high or low potential by the store means.

As for a method of attaining a higher density of the DRAM, it has been proposed to make memory cells constructed in a three-dimensional manner to reduce its area. For example, a stacked capacitor memory cell (STC cell) is described in an article of 1978 IEDM, Digest of Technical Papers, pp. 348-351. In this structure, an area required for a silicon substrate to provide a storage capacitor may be substantially equal to an area of a connection hole between a MOS transistor and a storage electrode so that an area of the memory cell becomes small.

However, there is a limitation in reduction of the are of the memory cell by such improvements in the structure of the a storage capacitor. A one-transistor/ one-capacitor type memory cell requires a connection hole between the cell and a data-line, a gate portion of a MOS transistor, a connection hole between the MOS transistor and the storage node and a space for electrically insulating this memory cell from other memory cells. Therefore, the area of the memory cell depends on such elements.

There is proposed another method in which the structure of the MOS transistor is also constructed in a three-dimensional manner to reduce more area of the memory cell. However, in this method, the manufacturing process becomes complicated. As a result, the investment amount of the manufacturing facilities is increased and the yield of memory cells is lowered. Therefore, even if the area is reduced, the ratio of the cost to the storage capacity is not decreased by this method.

SUMMARY OF THE INVENTION

The feature of the present invention is that a plurality of memory cells each having a switch and storage means for information are connected in a cascade manner. That is, a plurality of storage means are connected in a cascade manner by a plurality of switches controlled by plural word-lines parallel with one another. Such, a group of cascade-connected memory cells is referred to as simply "a memory cell block", when applicable. One end of the group of cascade-connected memory cells constitutes a terminal for transferring therethrough a signal to or from the external side of the memory cell block and is connected to the data-line.

In this arrangement, the operation of reading or writing information from or to storage means in the memory cell block is performed by controlling a plurality of switches in the memory cell block by a plurality of word-lines, through the connection terminal to externals of the memory cell block.

In this arrangement, since the connection terminals are provided for transferring therethrough signals to or from the externals corresponding to each memory cell block including therein the plural storage means, the number of connection holes to the data-lines is decreased and the area thereof is reduced. Moreover, in the device of the present invention, the switches are disposed between the storage means so that the electrical isolation between the storage means is effected by the switches. Therefore, an isolation region between the storage means is provided only for every memory cell block and thus the area is reduced compared with the large area required for the prior art memory.

Therefore, according to the present invention, it is possible to reduce the chip area of the semi-conductor memory device to realize high integration. Moreover, in order to realize the devices of the present invention, no complicated manufacturing process needs to be introduced. Thus, the invented devices can be realized by using the same manufacturing process as in the prior art semiconductor memory.

It is therefore an object of the present invention to provide an inexpensive semiconductor memory device of a large capacity in which an area of a memory cell is reduced without a complicated manufacturing process.

These objects and many of the attendant advantages of this invention will become better understood by reference to the following detailed description when considered in connection with the accompanying drawings.

BRIEF DESCRIPTION OF THE DRAWINGS

FIG. 1 is a conceptual diagram of the present invention showing the arrangement of the memory cell block of the invention;

FIG. 12B is a plan view of the same example shown in FIG. 11;

FIG. 20A is a cross sectional view showing the arrangement of the memory cell block in FIG. 19;

DESCRIPTION OF THE PREFERRED EMBODIMENTS

Figure 2:
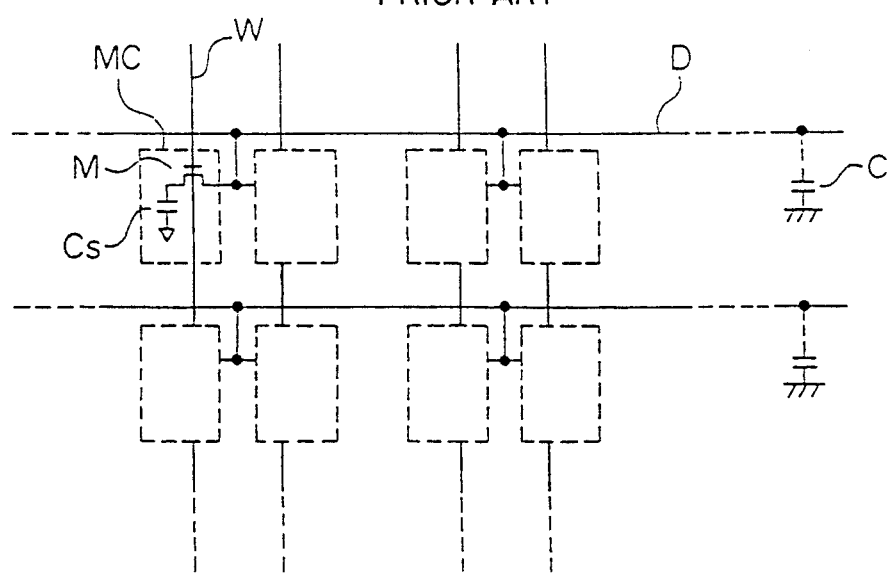
FIG. 2 is a conceptual diagram for explaining the prior art.

Several preferred embodiments of the present invention are described with reference to the accompanying drawings.

The present invention will hereinafter be described on the basis of the preferred embodiments. Incidentally, elements which are designated by the reference numerals in each of embodiments are as follows:

MC : a memory cell,
MCB : a memory cell block,
SW : a switch,
MM : storage means,
W : a word-line,
D : a data-line,
M : a MOS transistor,
Cs : a storage capacitor,
SN : a storage electrode,
PL : a plate electrode,
MCA : a memory cell array,
CD : a global data-line,
DCB : a dummy cell block,
DCA : a dummy cell array,
DS : signal transfer means,
SA : sense means,
DR : a register circuit,
IO : an input-output line,
PD : a precharge circuit,
LD a load circuit.

FIRST EMBODIMENT

FIG. 1 is a conceptual diagram for illustrating the principle of the present invention through a memory cell block of the invention which is arranged by connecting in a cascade manner a plurality of memory cells made up of switches and storage means. More specifically, there shows an arrangement of a memory cell block MCB for storing information including a plurality of switches $SW_1, SW_2, \ldots, SW_n$ (in this embodiment, the number thereof is n) connected in series and controlled via word-lines $W_1, W_2, \ldots, W_n$ arranged parallel with one another, and a plurality of storage means $MM_1, MM_2, \ldots, MM_n$ connected to the associated connections.

The basic operation to read and write of this arrangement is as follows. For example, the operation of reading an information from the k-th storage means $MM_k$ connected to the k-th connection (where $1 \leq k \leq n$) counted from the end terminal NB is performed in such a way that all of the switches $SW_1, SW_2, \ldots,$ and $SW_k$ connected between the terminal NB and the storage means $MM_k$ are turned on by the control signals via the wordlines $W_1, W_2, \ldots,$ and $W_k$, respectively, and then the information stored in the means $MM_k$ is read out to the terminal NB. Meanwhile, the operation of writing information to the k-th storage means $MM_k$ is performed in such a way that all of the switches $SW_1, SW_2, \ldots,$ and $SW_k$ are turned on and the information received through the terminal NB is written to the means $MM_k$. The reading or writing operation with the storage means within the memory cell block MCB will be described in more detail later.

In the present embodiment shown in FIG. 1, the terminal NB is a terminal for transferring therethrough the information between the memory cell block MCB and the external side thereof. Therefore, sense means and information write means are connected to the terminal NB.

Figure 3:
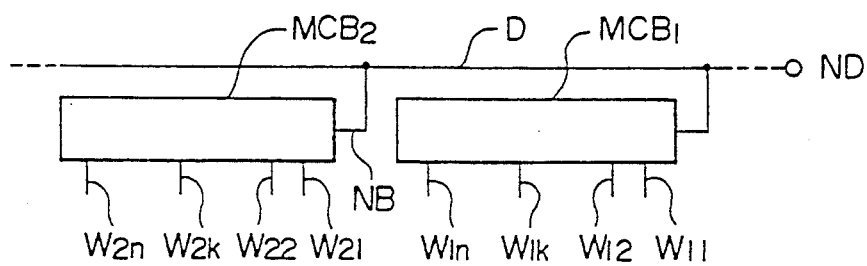
FIG. 3 is a block diagram showing the arrangement of an embodiment of the present invention employing a data-line.

Moreover, as an embodiment shown in FIG. 3, the memory cell block may be arranged in such a way that a data-line D perpendicular to each of the word-lines W is provided and the above-mentioned terminal NB is connected to the data-line. In this embodiment, as shown in FIG. 3, a plurality of memory cell blocks ($MCB_1, MCB_2$ etc.) each being shown in FIG. 1 may be connected to the data-line D. A signal which is read out from one of the storage means MM (any one from $MM_1, MM_2, \ldots,$ and $MM_n$) in the memory cell block MCB to the terminal NB is transferred to a terminal ND through the data-line D and is then sensed by the sense means. Moreover, a signal which is inputted to the terminal ND by the write means is transferred to the terminal NB through the data-line D to be stored in the storage means MM in the memory cell block MCB. As described above, the reading or writing of the information from or to the storage means in the memory cell block is performed through at least one switch connected between the storage means and the terminal NB. Therefore, in the term of operating speed or the like, there is a limitation in the number of memory cells which are connected in the memory cell block in a cascade manner. Then, in the present embodiment shown in FIG. 3, by connecting the plurality of memory cell blocks to the data-line instead of increasing the number of memory cells in a memory cell block, it is possible to increase the number of memory cells per sense means or write means. Therefore, it is correspondingly possible to reduce an occupation area factor of the sense means and write means.

Figure 4:
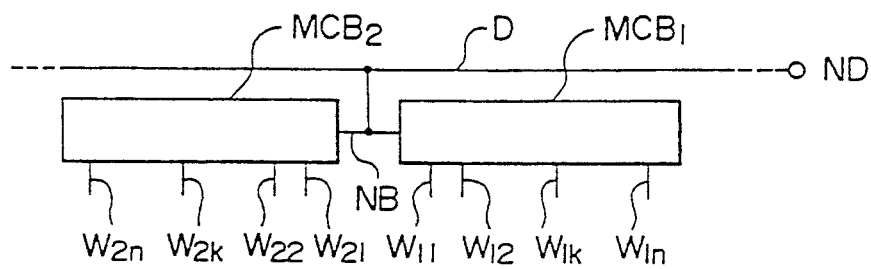
FIG. 4 is a block diagram showing the arrangement of a further embodiment of the present invention employing a data-line.

FIG. 4 is a block diagram showing the arrangement of a further embodiment employing the data-line. The present embodiment is arranged in such a way that two memory cell blocks $MCB_1$ and $MCB_2$ are disposed so as to confront with each other thereby to share a connection of the data-line D. The number of connections between the memory cell blocks and the data-line is reduced to one half of that of the embodiment shown in FIG. 3, and therefore, a required area for the connections can be further reduced.

In the embodiments shown in FIG. 1, FIG. 3 and FIG. 4, the memory cell block MCB is constructed by the n memory cells which are connected in a cascade manner, and only one terminal NB for transferring therethrough a signal between the memory cell block MCB and the externals is provided in the memory cell block. As a result, it is possible to reduce the number of the connections between the memory cell blocks and sense means, the write means and the data-line. Thus, it is possible to reduce the necessary area for the connection. In other word, it is possible to realize higher density. Moreover, in the memory cell block MCB, the electrical isolation between the storage means MM can be performed by the cascade-connected switches SW. Thus, it is not necessary to provide specially an isolation region between the storage means which is required by the prior art. As a result, it is possible to reduce the area per memory cell.

SECOND EMBODIMENT

Figure 5:
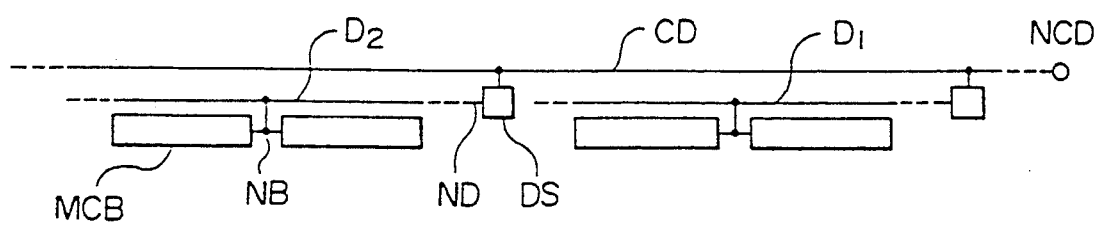
FIG. 5 is a block diagram showing the arrangement of an even further embodiment of the present invention in which in addition to the data-line, a global data-line is provided.

FIG. 5 is a block diagram showing the arrangement of an even further embodiment of the present invention. The present embodiment is an example wherein the data-line in the embodiment shown in FIG. 4 is provided in two hierarchies. More specifically, the present embodiment is arranged in such a way that the data-line D shown in FIG. 4 to which a plurality of memory cell blocks MCB are connected is divided into plural lines, e.g., $D_1$ and $D_2$, a global data-line CD is provided in parallel with those data-lines $D_1$ and $D_2$, and a signal is transferred between the data-lines and the global data-line through the signal transfer means DS which is capable of being operated selectively. The problems of layout and area increase may be solved by making the global data-line CD in another conductive layer from the layer of forming the word-lines W and the data-lines $D_1$ and $D_2$.

A signal which is read out from the memory cell block MCB to the data-line $D_1$ or $D_2$ is transferred to a terminal NCD through signal transfer means DS and the global data-line CD and is then sensed by the sense means. Moreover, the operation of writing an information to the memory cell block MCB is performed in such a way that a signal which is inputted to the terminal NCD by the write means is transferred to the data-line $D_1$ or $D_2$ through the global data-line CD and the signal transfer means DS.

In the present system, since the data-line is divided, the stray capacitance thereof is small. Moreover, since only small number of signal transfer means corresponding to the division number of datalines are connected to the global data-line CD, the stray capacitance thereof is also small. Therefore, since the stray capacitance existing in the signal transferring path from the memory cell block MCB to the terminal NCD is correspondingly small, the signal is transferred at a high speed. Further, if the signal transfer means DS is operated in the reading operation in a state in which the input impedance viewed the data-line $D_1$ or $D_2$ is high, the stray capacitance of the global data-line CD is electrically separated from that of the data-line $D_1$ or $D_2$. Therefore, if this signal transfer means is applied to the memory cell in which the storage means is constructed by a capacitor, the memory cell is free from the stray capacitance of the global data-line, and the magnitude of the signal voltage read to the data-line can be increased all the more. Moreover, by providing the signal transfer means DS with the function of amplifying a signal it is possible to operate the memory cell block at a high speed.

Incidentally, in the embodiment shown in FIG. 3 as well, the memory cell block may be arranged in such a way that the signal transfer means DS for separating the stray capacitances of the data-line D from the memory cell block MCB in the reading operation as described above, is inserted between the terminal NB of the memory cell block MCB and the data-line D, and that the signal is transferred through such signal transfer means. Though the number of signal transfer means is increased corresponding to that of memory cell blocks MCB, in this case, it is also possible to increase the magnitude of the signal voltage read out to the terminal NB of the memory cell block MCB.

THIRD EMBODIMENT

Figure 6:
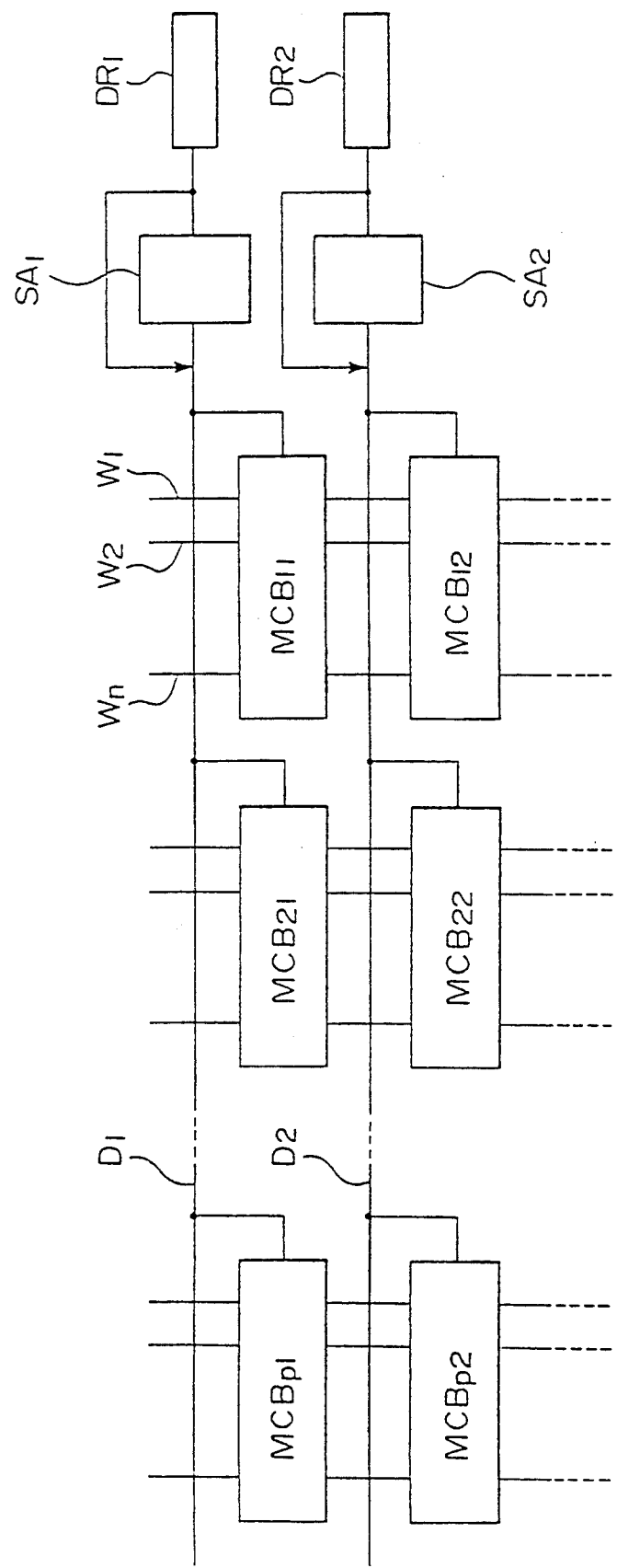
FIG. 6 is a block diagram showing one example of the arrangement of memories according to the present invention employing a register circuit.

FIG. 6 is a block diagram showing an arrangement of a memory cell array based on the embodiment shown in FIG. 3. That is, the present embodiment is arranged in such a way that the memory array is provided with a plurality of data-lines D ($D_1$, $D_2$ etc.), and sense means SA ($SA_1$, $SA_2$ etc.) and register circuits DR ($DR_1$, $DR_2$ etc.) are connected to each of the plural data-lines D which is connected with a plurality (e.g., number of p) of memory cell blocks MCB ($MCB_{11}$, $MCB_{12}$ etc.) shown in FIG. 1. The register circuit DR serves to temporarily save the information of the storage means MM in the memory cell block MCB, in the reading or writing operation. In this figure, for brevity, an address buffer, a decoder, a driver, an input-output line, a read-write controller and the like are omitted.

Reading or writing of the storage means $MM_k$ in a certain memory cell block MCB, e.g., $MCB_{11}$ is performed in the following manner. First, a switch $SW_1$ in the memory cell block $MCB_{11}$ is turned on by a word-line $W_1$ to read out the information from the storage means $MM_1$ and the information thus read is sensed by the sense means SA. Then, the sensed result is stored in the register circuit $DR_1$. Subsequently, the switches $SW_1$ and $SW_2$ are turned ON to read out the information from the storage means $MM_2$ and the information thus read is sensed by the sense means $SA_1$. Then, the sensed result is stored in the register circuit $DR_1$. Thus, in the order of $MM_1$, $MM_2$, . . . , and $MM_{k-1}$, the information is shifted from the storage means to the register circuit $DR_1$. Moreover, the switches $SW_1$, $SW_2$, . . . , and $SW_k$ are turned on to read out the information from the storage means $MM_k$ and the information thus read is sensed by the sense means $SA_1$. The sensed result is outputted to the externals of the chip thereby to allow the information of the storage means $MM_k$ in a certain memory cell block MCB to be read out. Moreover, if necessary, the sensed result is restored in the storage means $MM_k$ through the data-line. On the other hand, the writing operation is, when the switches $SW_1$, $SW_2$, . . . , and $SW_k$ are in an on state, performed by writing the information inputted from the external side of the chip to the storage means $MM_k$ through the data-line. Thus, after completing the operations of reading and writing the information from and to the storage means $MM_k$, the switch $SW_k$ is turned off and the information stored in the register circuit $DR_1$ is made to return to the memory cell block $MCB_{11}$ from which the information was read out. First, the information in the storage means $MM_{k-1}$ is read out from the register circuit $DR_1$ to the data-line $D_1$ to be written to the storage means $MM_{k-1}$ in the memory cell block $MCB_{11}$ through the switches $SW_1$, $SW_2$, . . . , and $SW_{k-1}$. Subsequently, the switch $SW_{k-1}$ is turned off, and when the switches $SW_1$, $SW_2$, . . . , and $SW_{k-2}$ are in an on state, the information of the storage means $MM_{k-2}$ is read out from the register circuit $DR_1$ to be restored in the storage means $MM_{k-2}$ in the memory cell block $MCB_{11}$. In a similar manner, in the reverse order of the reading operation, the restoring operation is performed up to the storage means $MM_1$. Finally, the switch $SW_1$ is turned off, and the reading or writing operation is then completed. By the above operation, reading or writing of the information from or to any storage means in the memory cell block can be performed. Moreover, in the case where the memory cell block $MCB_{11}$ is selected, the memory cell block $MCB_{12}$ and the like connected to the same word-line are also simultaneously selected so that the same operation as in the above description is performed. The selection of those memory cell blocks is performed in the same manner as in the prior art DRAM by the Y decoder (not shown). Further, the selection of the memory cell blocks ($MCB_{11}$, $MCB_{12}$ etc.) along the data-line can be performed by the selection of the wordline.

In this operation method, the information of the storage means MM (in the above description, $MM_k$) which is finally read out from the memory cell block MCB is not stored in the register circuit DR but is directly read out to be written. Therefore, the register circuit DR has only to have the storage capacity smaller than that of the memory cell block MCB by the information content of one storage means MM.

Now, in the above description, reading and writing of the k-th storage means in the memory cell block has been described. However, as apparent from the description, reading and writing are also carried out up to the (k−1)-th storage means to perform reading and writing of the k-th storage means. Then, such a method may be taken that all the storage means in the memory cell block, i.e., the storage means from first to n-th are always read out and that only the information of the desired storage means is outputted to the external side of the chip. In this method, the writing operation is performed in such a way that in the restore after the reading operation, instead of the information read out, the write information inputted from the externals of the chip is written in the desired storage means. Thus, all the storage means in the memory cell block are always operated so as to be read out and restored, so that the selection number of word-lines per cycle becomes constant regardless of the position of the storage means, which is intended to be read out or written, in the memory cell block. As a result, the control of the word-line becomes easy.

Moreover, in the above description, with respect to the method of reading out the information of a certain storage means to the externals of the chip, the description was given in such a way that the signal from the storage means is sensed by the sense means and the sensed result is outputted. However, alternatively, such a method may be taken that after the information in the memory cell block is stored in the register circuit DR, the information is outputted from the register circuit DR to the externals of the chip. Moreover, by replacing the information of the register circuit DR with the information inputted from the externals, the writing operation can be performed. In this case, the storage capacity of the register circuit DR is set to the same storage capacity as that of one memory cell block MCB. In accordance with this method, if the register circuit DR is arranged in such a way that the random access can be performed, out of the information stored in the register circuit DR, arbitrary information can be read out or written. Moreover, in the case where certain information or a series of information is intended to be repeatedly read out, the information can be read out from the register circuit DR. Thus, it is possible to perform the reading operation at a high speed and with low power consumption.

Further, in the above description, the information data in one memory cell block are considered to be individually independent from one another and thus the description has been given with respect to the method of inputting or outputting arbitrary information. In the present invention, however, since a plurality of information data in one memory cell block are read out in a time series manner, it is also possible to output the information of one memory cell block to the externals of the chip in the form of one group of serial information. In the writing operation, it is also possible to write such information in the form of one group of serial information. In this case, since no selection of the information in the memory cell block is required and such information may be inputted as the serial information, the control of inputting or outputting of the information becomes simply.

As described hereinabove, by using the register circuit DR, it is possible to carry out the reading and writing operations, without erasing the information stored in the storage means in the memory cell block. When the present memory arrangement is compared with the memory arrangement employing the prior art DRAM, the register circuit DR is additionally required. However, since the register circuit DR is shared among a great number of memory cell blocks MCB, the number thereof may be small. As described above, since by providing the memory cell block MCB, the number of connections between the memory cell blocks and the data-line is decreased and the area is reduced, the chip area of the whole memory is decreased

FOURTH EMBODIMENT

Figure 7:
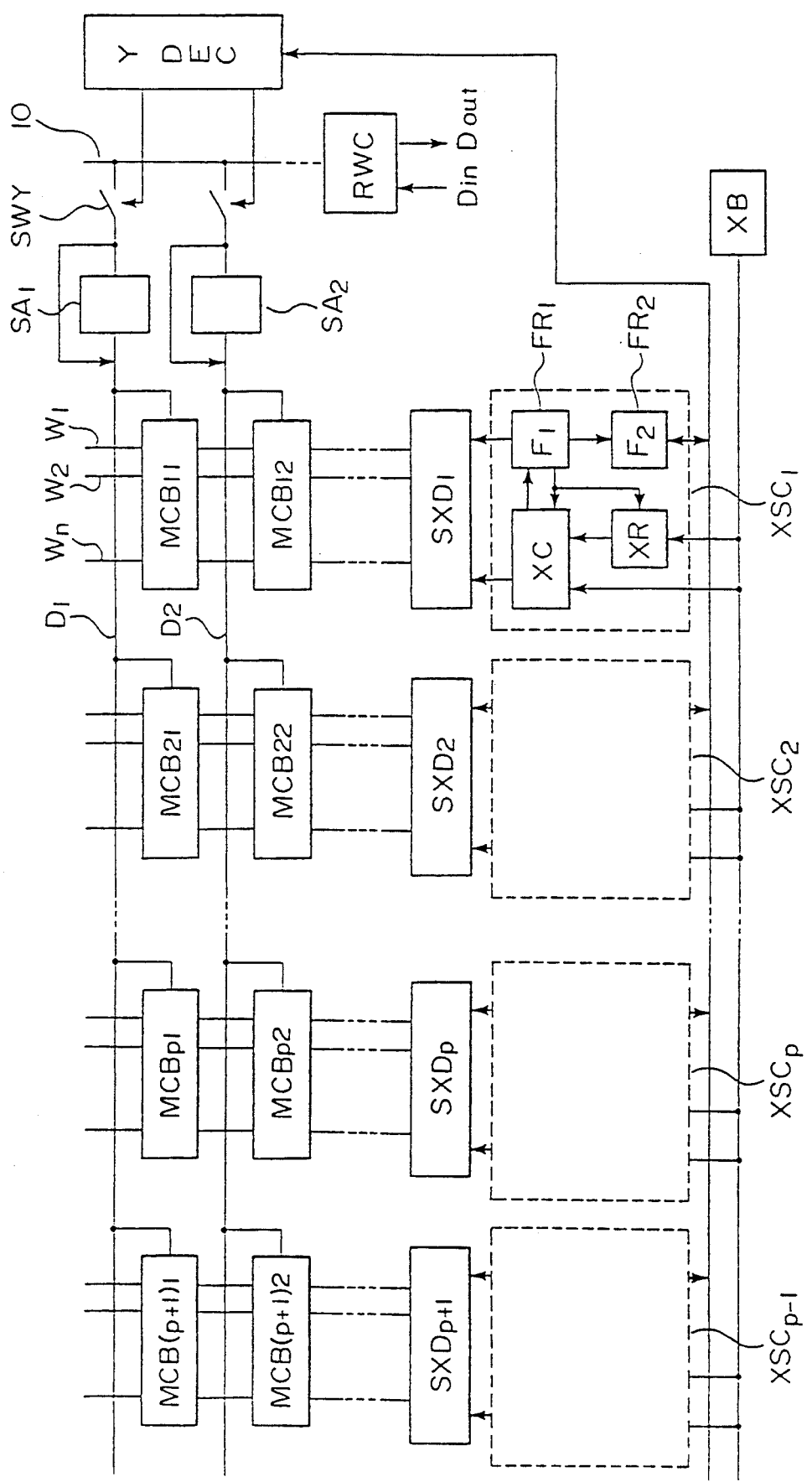
FIG. 7 is a block diagram showing a further example of the arrangement of the memories according to the present invention.

FIG. 7 is a block diagram showing the arrangement of another embodiment of the present invention. The present embodiment is arranged in such a way that the register circuit DR in the embodiment shown in FIG. 6 is removed and its function is performed by a memory cell block MCB in a memory cell array. The memory cell block MCB has the same arrangement as that shown in FIG. 1 and is made up of n switches SW and n storage means MM. The memory cell blocks MCB are disposed in a matrix arrangement and are connected to a data-line D to which sense means SA is connected. Incidentally, the memory cell blocks MCB are provided every data-line so that the number thereof exceeds needed for the storage capacity by one. FIG. 7 shows a specific case where the storage capacity per data-line is (n×p) bits. In the embodiment shown in FIG. 6, the number of memory cell blocks MCB per data-line is p. However, in the present arrangement, the number thereof is (p+1). Therefore, one of the plurality of memory cell blocks MCB connected to one data-line D is in a state in which there is no information (referred to as "the empty state", when applicable).

Sense means SA is connected to the data-line D. Moreover, there is provided an input-output line IO to which a read-write controller RWC is connected and which is connected to the data-line D by a switch SWY controlled by a Y decoder YDEC.

Now, the reading operation in the present embodiment is performed in such a way that the information is read out from n storage means MM in a certain memory cell block MCB and the information thus read is restored in the memory cell block MCB in the empty state. In the embodiment shown in FIG. 6, the information read out from a certain memory cell block MCB is temporarily stored in the register circuit DR and that information is restored in the original memory cell block MCB, whereas in the present embodiment, such information is shifted to the subsequent memory cell blocks one after another. Therefore, the register circuit DR shown in the embodiment of FIG. 6 becomes unnecessary. However, in the present embodiment, the information is stored in the subsequent memory cell block MCB every reading operation. That is, position of the information is moved in the memory cell array every reading operation. Moreover, the operation of reading the information in the memory cell block MCB is started from the storage means MM near the terminal for transferring therethrough a signal to or from the dataline D, while the writing operation (the operation of restoring the information in the subsequent memory cell block) is started from the storage means MM far the terminal for transferring therethrough a signal to or from the data-line D. That is, by restoring the information, the order of the information data in the memory cell block are reversed. Therefore, it is necessary to remember which memory cell block certain information is stored and which order the information data are stored.

Then, in the present embodiment, an X decoder for selecting a memory cell block and a word-line in the memory cell block is made up of sub-X decoders SXD ($SXD_1$, $SXD_2$ etc.) and X address control means XSC ($XSC_1$, $XSC_2$ etc.). The sub-X decoder SXD is a decoder for selecting and controlling one of the word-lines $W_1$, $W_2$, ..., and $W_n$ in the memory cell block MCB. Moreover, the X address control means XSC is used for selecting a memory cell block MCB. The X address control means XSC is made up of an X address register XR for storing an X address of the corresponding memory cell block, an X address comparator for judging whether or not an address inputted to an X address buffer XB coincides with an address stored in the X address register XR, and flag registers $FR_1$ and $FR_2$ for storing respective flags $F_1$ and $F_2$. The flag $F_1$ is used to indicate whether or not the memory cell block is in the empty state. In the present embodiment, when the memory cell block is in the empty state, "1" is designated thereto. The flag $F_2$ is used to indicate the order of the information data in the memory cell block.

The operation will be carried out in the following manner.

First, an X address which is inputted to the X address buffer XB from the external side of the chip is transferred to each of the X address control means XSC. That X address is compared with an address stored in the X address register XR by the X address comparator XC. When one address coincides with the other address and the flag $F_1$ is "0", i.e., the memory cell block MCB is not in the empty state, the sub-X decoder SXD corresponding to the X address control means XSC is selected. The word-line W is controlled by the sub-X decoder SXD so that the reading operation of the corresponding memory cell block MCB is performed. Moreover, when the information of the flag $F_1$ is sent to memory cell block MCB is in the empty state, the sub-X decoder SXD is selected and the writing of the information to the corresponding memory cell block MCB is performed.

In this case, the description will be given on the assumption that the memory cell block $MCB_{11}$ is in the empty state and the reading of the information from the memory cell block $MCB_{21}$ is performed. First, the word-line of the memory cell block $MCB_{21}$ is controlled by the sub-X decoder $SXD_2$ so that the switch $SW_1$ in the memory cell block $MCB_{21}$ is turned on and the information is read out from the storage means $MM_1$ in the memory cell block $MCB_{21}$ to the data-line D. The signal corresponding to that information is sensed by the sense means $SA_1$ so that the information is discriminated. On the other hand, the word-line of the memory cell block $MCB_{11}$ is controlled by the sub-X decoder $SXD_1$ so that all the switches SW in the memory cell block $MCB_{11}$ are turned on and the discriminated result is stored in the storage means $MM_n$ in the memory cell block $MCB_{11}$. Subsequently, the switch $SW_n$ in the memory cell block $MCB_{11}$ is turned off and the switch $SW_2$ in the memory cell block $MCB_{21}$ is turned on, so that the information is read out from the storage means $MM_2$ in the memory cell block $MCB_{21}$ to the data-line $D_1$, and the information thus read is sensed by the sense means $SA_1$ to be stored in the storage means $MM_{n-1}$ in the memory cell block $MCB_{11}$. In the similar manner, the information stored in the storage means in $MCB_{21}$ is shifted to the storage means in $MCB_{11}$. Since the memory cell block $MCB_1$ is in the empty state and the memory cell block $MCB_{11}$ is not in the empty state through the above operation, the flag $F_1$ in the X address control means $XSC_2$ goes to "1" and the flag $F_1$ in the X address control means $XSC_1$ goes to "0". Moreover, the address inputted to the X address buffer XB is, as the X address of the memory cell block $MCB_{11}$, stored in the X address register XR in the X address control means $XSC_1$. Further, since the order of the information data in the memory cell blocks are reversed so that the information is shifted from the memory cell block $MCB_{21}$ to the memory cell block $MCB_{11}$, the information of the flag $F_2$ in the X address control means $XSC_2$ is inverted to be stored in the flag register $FR_2$ in the X address control means $XSC_1$.

Outputting of the information to the externals of the chip is performed in such a way that when the information read out from the desired storage means in the memory cell block $MCB_{21}$ is discriminated by the sense means SA, the switch SWY is selected by the Y decoder YDEC and the information is transferred to the input-output line IO to be an output data Dout by the read-write controller RWC. Inputting of the input data Din is performed in such a way that when the information is restored in the memory cell block $MCB_{11}$, the switch SWY is selected so that the input data Din is transferred from the input-output line IO to the dataline $D_1$ through the read-write controller RWC. The position of the desired information in the memory cell block MCB, i.e., the number of the storage means from the terminal with the data-line where that information stored is selected by the address information inputted to the Y decoder YDEC and the flag $F_2$ in the X address control means XSC.

In the present embodiment, the register circuit DR which was used in the embodiment shown in FIG. 6 becomes unnecessary, and therefore, no writing and reading operation of the register circuit DR are required. As a result, the cycle time required for reading or writing of the memory cell blocks MCB becomes short. Moreover, the power consumption becomes small. In an area aspect, the additional number of memory cell blocks MCB is required for a data-line by one and the X address control means XSC for comparing the X addresses with each other is also required. However, since the register circuit DR of FIG. 6 is not required, the arrangement of the present embodiment may be small in area as compared with the arrangement of FIG. 6 in some cases.

FIFTH EMBODIMENT

Figure 8:
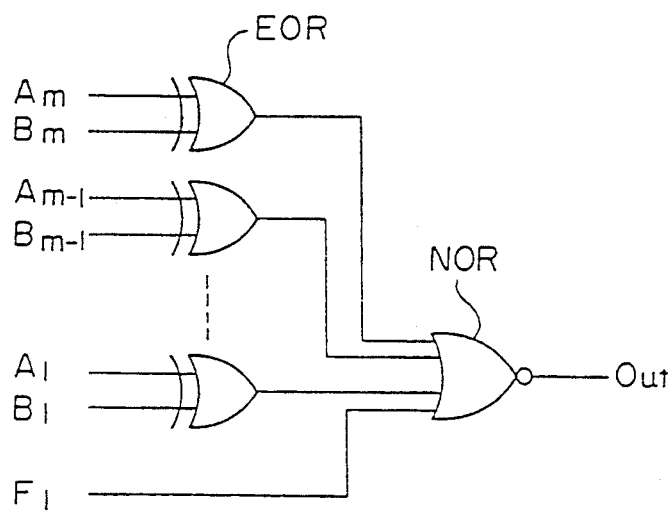
FIG. 8 is a circuit diagram showing one example of the arrangement of logical circuits used in the memory arrangement shown in FIG. 7.

FIG. 8 is a circuit diagram showing an example of the arrangement of the X address comparator XC. It is assumed that p is 2 to the m-th power. Then, in order to select the p memory cell blocks MCB, the address information of m bits is required. It is also assumed that the address outputted from the X address buffer XB is expressed in the form of m bits of $B_m B_{m-1} \ldots B_1$ and the address stored in the X address register XR is expressed in the form of m bits of $A_m A_{m-1} \ldots A_1$. The X address comparator XC used in the embodiment shown in FIG. 7 outputs "1" when $A_m, A_{m-1}, \ldots,$ and $A_1$ coincide with $B_m, B_{m-1}, \ldots,$ and $B_1$, respectively and the flag $F_1$ is "0", and outputs "0" in other cases. Then, in the present embodiment shown in FIG. 8, there is shown an example which is made up of m exclusive OR circuits (EOR gates) and a multiple input NOR gate. The EOR gate is a comparator having two inputs and is a circuit which outputs "0" when two inputs coincide with each other and outputs "1" when the two inputs are different from each other. $A_m$ and $B_m$, $A_{m-1}$ and $B_{m-1}, \ldots,$ and $A_1$ and $B_1$ are compared with one another by the m EOR gates, respectively. Only when the outputs of the m EOR gates and the flag $F_1$ are "0", the output of the multiple input NOR gate goes to "0". Thus, the above logic is realized.

Figure 9:
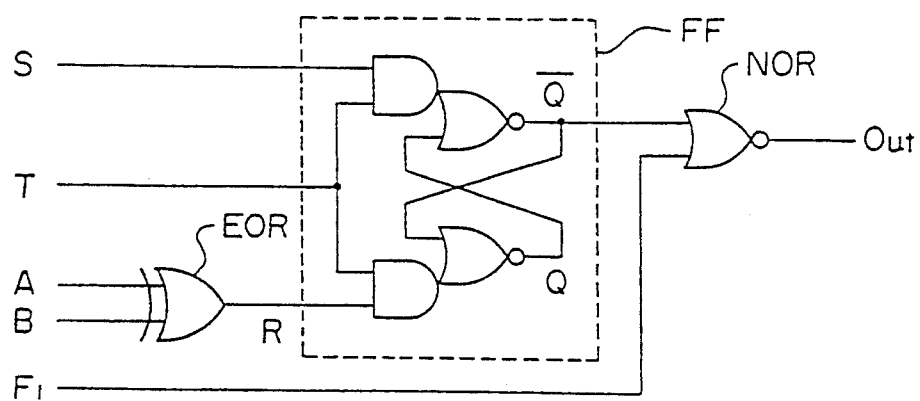
FIG. 9 is a circuit diagram showing a further example of the arrangement of logical circuits used in the memory arrangement shown in FIG. 7.

FIG. 9 is a circuit diagram showing another example of the arrangement of the X address comparator XC. The example shown in FIG. 8 is arranged in such a way that by using the m EOR gates, the comparison operations are simultaneously performed with respect to the m bits. The present example is, however, arranged in such a way that one EOR gate is multiply used in a time division manner and m digits are compared with one another in a time series manner. By employing an RS type flip-flop circuit FF, the EOR gate is multiply used in a time division manner.

The operation thereof is as follows. First, in the stand-by state, the input terminals A and B of the EOR gate are maintained at the same level ("0" or "1"), the reset terminal R of the flip-flop circuit FF is set to "0", and the set terminal S of the flip-flop circuit FF is set to "1", whereby the output terminal Q of the flip-flop circuit FF is set to "1" and $\overline{Q}$ is set to "0". Subsequently, after the clock terminal T is set to "0" and the set terminal S is set to "0", the X addresses are transferred from the X address buffer XB and the X address register XR to the X address comparator XC in a time series manner by one bit by one bit. First, $A_m$ and $B_m$ are inputted to the input terminals A and B of the EOR gate, respectively to be judged whether or not the two bits coincide with each other, and the comparison result is inputted to the reset terminal R of the flip-flop circuit FF. then, the clock terminal T is set to "1", so that the information at the reset terminal R is fetched to the flip-flop circuit FF. Since when $A_m$ and $B_m$ coincide with each other, the reset terminal R goes to "0", the output terminals Q and $\overline{Q}$ of FF are kept being "1" and "0", respectively. On the other hand, when $A_m$ and $B_m$ are different from each other, R goes to "1", and Q and $\overline{Q}$ are inverted to be "0" and "1", respectively. Next, the clock terminal T is returned to "0", $A_{m-1}$ and $B_{m-1}$ are respectively inputted to the input terminals A and B of the EOR gate, and the terminal T is again set to "1", thereby to fetch the information at the reset terminal R to the flip-flop circuit FF. When the output terminals Q and $\overline{Q}$ of the flip flop circuit FF are respectively "1" and "0", if $A_{m-1}$ and $B_{m-1}$ coincide with each other, Q and $\overline{Q}$) are respectively kept being "1" and "0", while if $A_{m-1}$ and $B_{m-1}$ are different from each other, Q and $\overline{Q}$ are inverted to be "0" and "1", respectively. In this connection, when Q and $\overline{Q}$ have already been "0" and "1", respectively, the logical levels of them are kept as they are. Therefore, in the same manner, the above operation is repeated up to $A_1$ and $B_1$ in such a way that each of the subsequent digit pairs up to $A_1$ and $B_1$ are respectively inputted to the input terminals A and B of the EOR gate, and the information at the reset terminal R is fetched to the flip-flop FF synchronistically with the clock inputted to the clock terminal T. As a result, only when $A_m$ and $B_m$, $A_{m-1}$ and $B_{m-1}$, . . . , and $A_1$ and $B_1$ coincide with one another, respectively, the output terminals Q and $\overline{Q}$ are kept being "1" and "0", respectively. On the other hand, when with respect to the combination of the two addresses, at least one digit pair does not coincide with each other, the output terminals Q and $\overline{Q}$ go to "0" and "1", respectively. By inputting the information at the output terminal $\overline{Q}$ and the flag $F_1$ to the NOR gate to make the output of the NOR gate to be the output of the X address comparator XC, it is possible to realize the same logic as that of the embodiment shown in FIG. 8. In the present embodiment, although the time required for obtaining the output becomes long, the EOR gate may be only one so that the area can be reduced.

FIG. 8 shows the arrangement in which the comparisons of m bits are performed in parallel, while FIG. 9 shows the arrangement in which the comparisons of m bits are performed in a time series manner. In this connection, in the arrangement of FIG. 8, there is provided the advantage in that the time required for obtaining the output is short, while in the arrangement of FIG. 9, there is provided the advantage in that the area is small. However, taking the equilibrium between the time and the area into consideration, the intermediate arrangement may be taken in some cases. For example, such an arrangement may be taken that the parallel comparisons of 2 bits are performed in a time series manner. Such an arrangement can be realized in such a way that in the arrangement of FIG. 9, the logical sum of the outputs of two EOR gates is applied to the reset terminal R of the flip-flop circuit FF.

SIXTH EMBODIMENT

Figure 10:
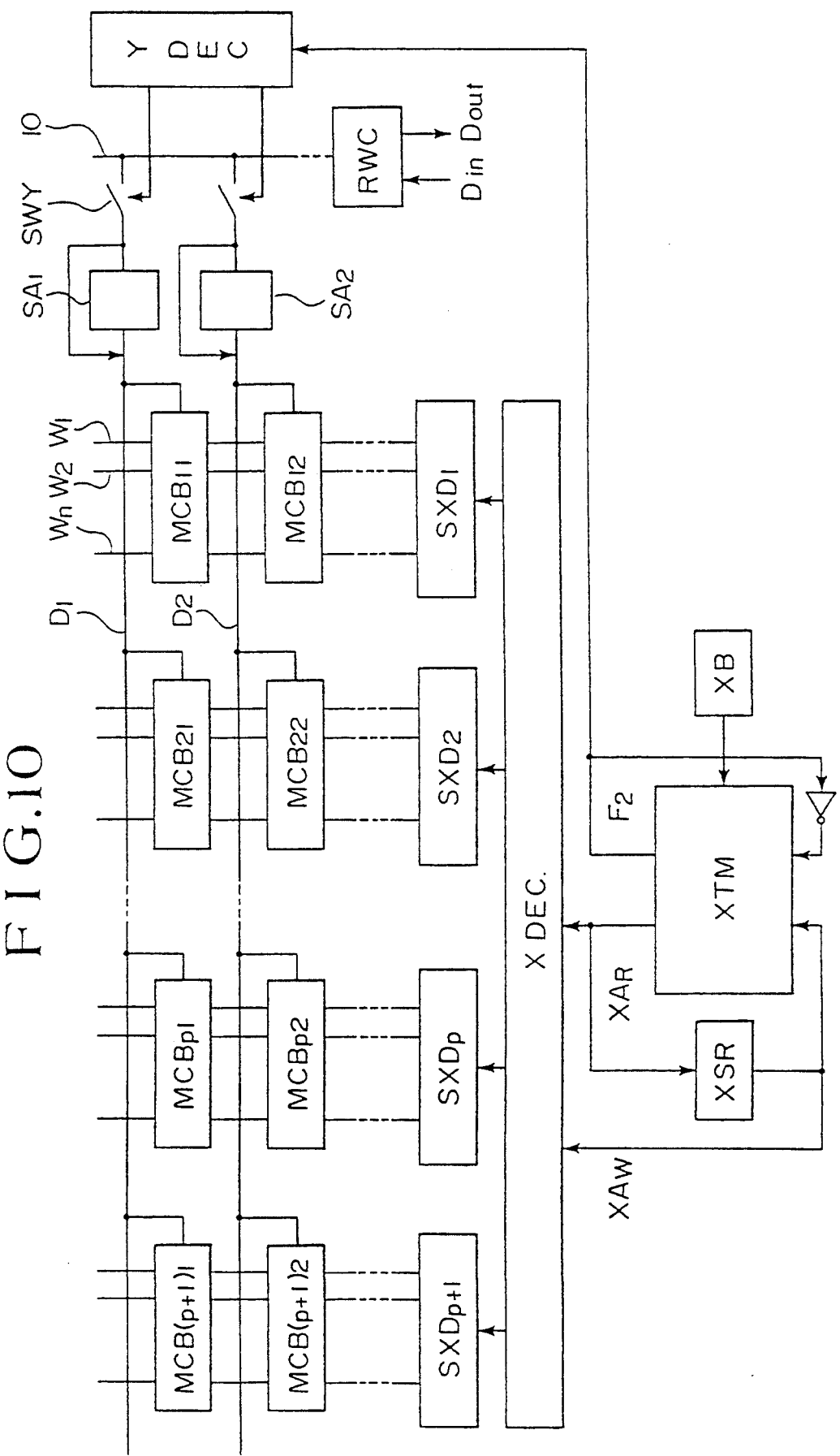
FIG. 10 is a block diagram showing an even further example of the arrangement of the memory associating with other peripheral circuits.

FIG. 10 is a block diagram showing the arrangement of still another embodiment in which in the same manner as in the embodiment shown in FIG. 7, the operation is performed by shifting the information among the memory cell blocks. In the embodiment shown in FIG. 7, the X addresses which are inputted from the externals to the respective memory cell blocks MCB are distributed among the X address registers XR in the X address control means XSC to be stored therein. On the other hand, the present embodiment shown in FIG. 10 is arranged in such a way that the relationship between the address inputted from the externals (referred to as "the external address", when applicable) and the address representing the position of the memory cell block in the chip (referred to as "the internal address", when applicable) is stored and such relationships are assembled in one memory to be stored therein in the form of an address translation table.

More specifically, as shown in FIG. 10, instead of the provision of the plurality of X address control circuits XSC, there is provided an X decoder XDEC, a memory XTM for the address translation table, and a register XSR for storing therein the X address of the memory cell block in the empty state. To the memory XTM is connected an X address buffer XB. In the same manner as in FIG. 7, the memory cell blocks MCB are disposed in a matrix arrangement, (p+1) memory cell blocks are connected to one data-line D, and correspondingly, (p+1) sub-X decoders SXD are disposed. Moreover, the data-line D is provided with the sense means SA which is connected to the input-output line IO having the read-write controller RWC through the switch SWY controlled by the Y decoder YDEC.

The operation will be performed in the following manner. The external address inputted to the X address buffer XB is transferred to the memory XTM and by using that external address as an address of XTM, the internal address (designated XAR) stored in XTM is read out. XAR is transferred to the X decoder XDEC to select the sub-X decoder SXD for controlling the reading operation. Moreover, the internal address (designated XAW) indicating the empty block is transferred from the register XSR to XDEC to select the sub-X decoder SXD for controlling the writing operation. For example, it is assumed that the sub-X decoder $SXD_2$ is selected by XAR and the sub-X decoder $SXD_1$ is selected by XAW. Then, in the same manner as in the description of the operation with respect to FIG. 7, the information is shifted among the memory cell blocks by the sub-X decoders $SXD_2$ and $SXD_1$. Moreover, the flag $F_2$ in FIG. 7, i.e., the order of the information data in the memory cell blocks are also stored in the memory XTM and such information is read out together with XAR. The flag $F_2$ is transferred to the Y-decoder YDEC and the switch SWY is correspondingly controlled thereby to transfer the signal to or from the input-output line IO.

Since the X address XAR indicating the memory cell block to be read out becomes the X address of the subsequent memory cell block in the empty state, it is stored in the register XSR. Moreover, the internal address corresponding to the external address inputted from the address buffer XB is changed from XAR to the X address XAW indicating the memory cell block to which the information is to be shifted. Then, as the internal address corresponding to the external address inputted from the address buffer XB, XAW is stored in the memory XTM. Further, since the order of the information data in the memory cell blocks is reversed, $F_2$ is inverted to be stored together with XAW in XTM.

In the present embodiment, instead of comparing the X addresses with each other by X address comparator XC in the arrangement shown in FIG. 7, the memory XTM for storing therein the address translation table is read out. Since the operation of a large number of X address comparators XC may be performed by one operation of reading the memory XTM, the power consumption is greatly reduced.

SEVENTH EMBODIMENT

The present invention will hereinafter be concretely described in accordance with an embodiment employing the memory cell block MCB in which a switch and storage means are constructed by a MOS transistor and a storage capacitor, respectively.

Figure 11:
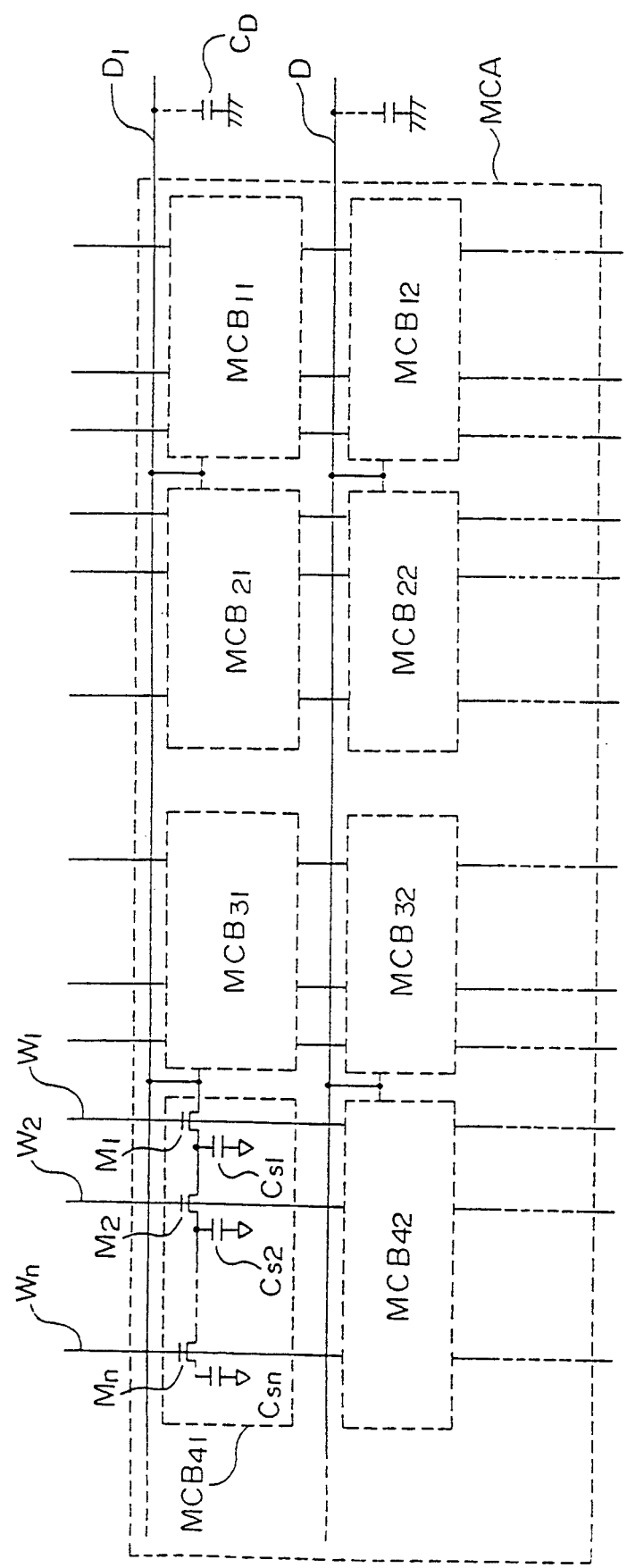
FIG. 11 is a circuit diagram showing a memory cell block of an embodiment employing a one-transistor/one-capacitor type memory cell.

FIG. 11 is a circuit diagram showing the arrangement of a concrete example of a memory cell array in which the memory cell blocks MCB (MCB$_{11}$, MCB$_{21}$ etc.) are disposed in a matrix arrangement. Each memory cell block MCB is arranged in such a way that each of n-channel MOS transistors M (M$_1$, M$_2$ etc.) and each of storage capacitors Cs (Cs$_1$, Cs$_2$ etc.) are used as a switch and storage means, respectively, as shown in FIG. 11. That is, the memory cell blocks are arranged by connecting n cells of the one-transistor/one-capacitor type memory cells to one another in a cascade manner. To each of the plural data-lines D (D$_1$, D$_2$ etc.) are connected plural memory cell blocks MCB. A plurality of word-lines W (W$_1$, W$_2$ etc.) for controlling the memory cell blocks MCB are disposed so as to cross the data lines.

The reading operation of the memory cell blocks MCB will be performed in the following manner. In the stand-by state, after the data-line is precharged at a certain potential to provide the floating state, the word-line W$_1$ is made to be at a high potential to turn the MOS transistor M$_1$ on. Then, the electric charge accumulated in the storage capacitor Cs$_1$ is redistributed between Cs$_1$ and the stray capacitance CD of the data-line D so that the potential of the data-line D is charged. It is judged by the sense means (not shown) connected to the data-line D whether the signal on the data-line is "1" or "0". Subsequently, after precharging the data-line D again, in addition to the word-line W$_1$, the word-line W$_2$ is also made to be at a high potential to turn both the MOS transistors M$_1$ and M$_2$ on. Then, the electric charge accumulated in the storage capacitor Cs$_2$ is redistributed among Cs$_1$, Cs$_2$ and the stray capacitance CD of the data-line D so that the potential of the data-line D is charged. The signal on the data-line D is discriminated by the sense means. Thus, after precharging the data-line D, the word-lines are made to be at a high potential in the order of W$_1$, W$_2$, ..., and W$_n$ to turn the MOS transistors on in the order of M$_1$, M$_2$, ..., and M$_n$ successively, so that the charge is read out to the data-line D from the storage capacitors in the order of Cs$_1$, Cs$_2$, ..., and Cs$_n$ thereby to discriminate the information by the sense means.

The writing operation of the memory cell block MCB will be performed in the following manner. First, all the word-lines W$_1$, W$_2$, ..., and W$_n$ are made to be at a high potential to turn on all the MOS transistor M$_1$, M$_2$, ..., and M$_n$. Under this condition, the data-line D is made to be at a high or low potential in accordance with the information to be stored. By making the word-line W$_n$ to be at a low potential, the MOS transistor M$_n$ is turned off so that the electric charge corresponding to the potential of the data-line D is stored in the storage capacitor Cs$_n$. Subsequently, under the condition in which M$_n$ is off, the data-line D is made to be at a potential corresponding to desired information, and the word-line W$_{n-1}$ is made to be at a low potential to turn the MOS transistor M$_{n-1}$ off so that the electric Charge corresponding to the potential of the data-line D is stored in the storage capacitor Cs$_{n-1}$. In such a manner, the data-line D is made to be at a high or low potential in accordance with the desired information, and in the reverse manner to the reading operation, the word-lines are made to be at a low potential in the order of W$_n$, W$_{n-1}$, ..., and W$_1$ to turn the switches off in the order of M$_n$, M$_{n-1}$, ..., and M$_1$ successively, so that the electric charge is stored in the storage capacitors in the order of Cs$_n$, Cs$_{n-1}$, ..., and Cs$_1$.

Although the reading operation and the writing operation have been individually described, in the practical use, by combining both the operations with each other, the operation is performed so as not to erase any information. As described in the embodiment shown in FIG. 6, the read out information is temporarily stored in the register circuit DR provided outside the memory cell array MCA and is then restored in the memory cell block which has been read out. Alternatively, as described in the embodiments of FIG. 7 and FIG. 10, the additional number of the memory cell blocks are set for a data-line by one. Then, after the information is read out from a certain memory cell block, the information thus read is stored in the block in the empty state.

Since the storage capacitor is used as the storage means, the refresh operation is required and thus the actual operation is performed by combining the reading operation and the writing operation with each other. In the prior art DRAM employing the one-transistor/one-capacitor type memory cell, the refresh operation is performed with the memory cell being treated as unit. In the present invention, however, the refresh operation is performed with the memory cell block being treated as unit. Therefore, while the cycle time required for one refresh operation is long, the number of refresh cycles is reduced to a number fractionized by n as compared with the prior art DRAM. Therefore, when the control of the refresh operation is performed from the externals of the chip, the number thereof may be reduced. Moreover, the time which is accessible from the externals can be made to be continuously long.

In the above arrangement, the MOS transistors connected to the data-line per memory cell block MCB is M$_1$, i.e., the number thereof is one. In the prior art DRAM, as shown in FIG. 2, the number of MOS transistors per memory cell is one, whereas in the present embodiment, the number thereof is one for n memory cells and therefore it is reduced to one fractionized by n. As a result, the number of diffusion regions connected to the data-line is small, so that the data-line capacitance CD can be reduced. As described above, in DRAM employing the one-transistor/one-capacitor type memory cell, the signal produced on the data-line is a potential change due to the re-distribution of the electric charge stored in the storage capacitor Cs, and therefore, the smaller the data-line capacitance CD is, the larger the magnitude of the signal is. In the memory cell array shown in FIG. 11, the storage capacitor connected to the MOS transistor forming a signal transfer path in the memory cell block MCB is coupled in parallel to the data-line capacitance C$_D$. Therefore, when the electric charge is read out from the k-th storage capacitor Cs$_k$ counted from the data-line, in addition to C$_D$, the re-distribution of the electric charge is performed among Cs$_1$, Cs$_2$, ..., and Cs$_{k-1}$. However, since the data-line capacitance C$_D$ is small, the signal having a sufficiently large magnitude is obtained. As a result, the reading operation can be realized at a high signal-to-noise ratio.

Let us assume that the data-line capacitance $C_D$ is considered to be made up of a component due to the diffusion layer to be connected (assumed as $C_M$ per transistor) and a component Co other than $C_M$. When p memory cell blocks are connected to each of the data-lines, the following equation is established.

$$C_D = p \times C_M + Co \qquad (1)$$

Let us assume that the magnitude of the storage voltage stored in the storage capacitor is Vs and the magnitude of the signal voltage produced on the data-line is Vsg. Then, the magnitude Vsig(k) of the signal voltage when reading out the electric charge from the storage capacitor $C_{sk}$ is given by:

$$V\text{sig}(k) = \frac{C_{sk}}{C_D + C_{s1} + C_{s2} + \ldots + C_{sk}} \times V_s \qquad (2)$$

When all the storage capacitors take the same value Cs, the equation (2) is rewritten to the following equation.

$$V\text{sig}(k) = \frac{C_s}{C_D + k \times C_s} \times V_s \qquad (3)$$

When k=n, the magnitude Vsig of the signal voltage takes the minimum value Vsig(n) in accordance with the following equation.

$$V\text{sig}(n) = \frac{C_s}{C_D + n \times C_s} \times V_s \qquad (4)$$

Then, if the denominator of the above equation (4) is put as Cc, the following equation is obtained using the equation (1).

$$\begin{aligned} Cc &= C_D + n \times C_s \qquad (5) \\ &= p \times C_M + Co + n \times C_s \end{aligned}$$

If the number of memory cells per data-line is N, the following equation is established.

$$N = P \times n \qquad (6)$$

Therefore, the equation (5) is rewritten to the following equation.

$$Cc = (N/n) \times C_M + Co + n \times C_s \qquad (7)$$

The smaller Cc is, the larger Vsig(n) is in accordance with the equation (4). Thus, it is possible to realize the reading operation at a high signal-to-noise ratio. Therefore, under the condition in which N is constant, and the optimal value of n with respect to the S/N ratio is present. For example, when $C_M = 0.4$[fF], Co = 100[fF], Cs = 20[fF] and N = 512, Cc of the equation (7) takes the minimum value of about 228 fF in the case of n = 3. Therefore, the arrangement in which three memory cells are connected to one another in a cascade manner to construct the memory cell block allows the magnitude of the signal voltage to be the maximum value. Thus, such an arrangement is preferable in terms of the signal-to-noise ratio. As shown in FIG. 12C, if one connection hole is shared between two memory cell blocks, such an arrangement will be preferable that six storage means is connected to one connection hole.

Moreover, taking the aspect of using the semiconductor memory device into consideration, since the operation of treating 2 to the n-th power as unit is desirable, it is preferable that two or four memory cells are connected to one another in a cascade manner to construct the memory cell block.

As another effect due to the less number of diffusion layers connected to the data-line, there is the reduction of α-particle-induced soft-error of the data-line mode. The soft-error of the data-line mode is a phenomenon wherein the electric charge which is generated in the substrate by the application of the α-particles is collected in the data-line which is in the floating state in the reading operation so that the information is judged by mistake. Since the number of diffusion layers connected to the data-line is small, the possibility of the electric charge generated in the substrate being collected in the data-line is small and the probability of an error in judgement occurring is small.

EIGHTH EMBODIMENT

Figure 12A:
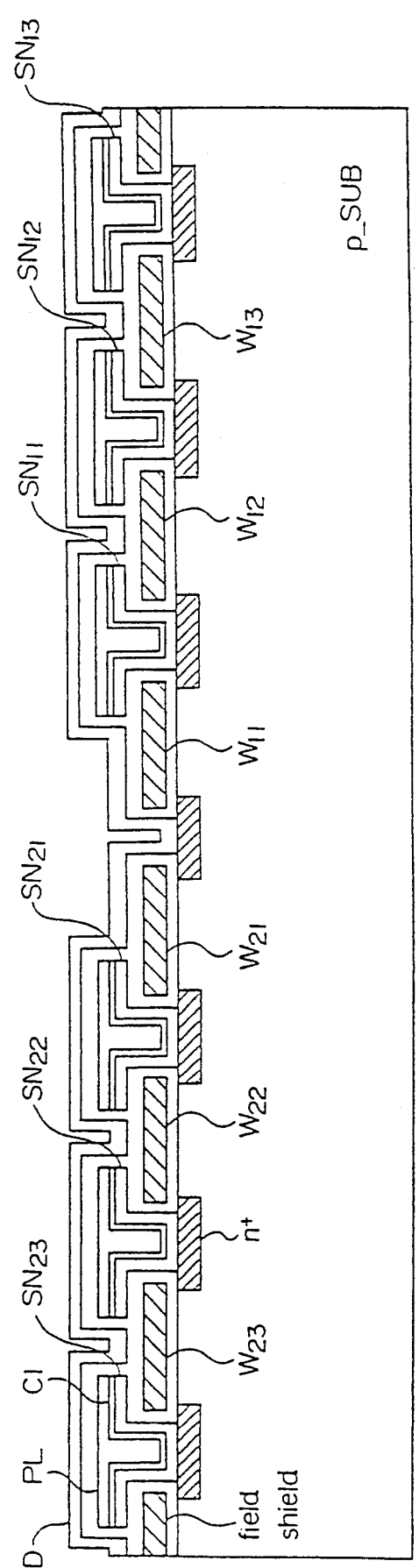
FIG. 12A is a cross sectional view illustrating one example of the arrangement of the memory cell block shown in FIG. 11.
Figure 12C:
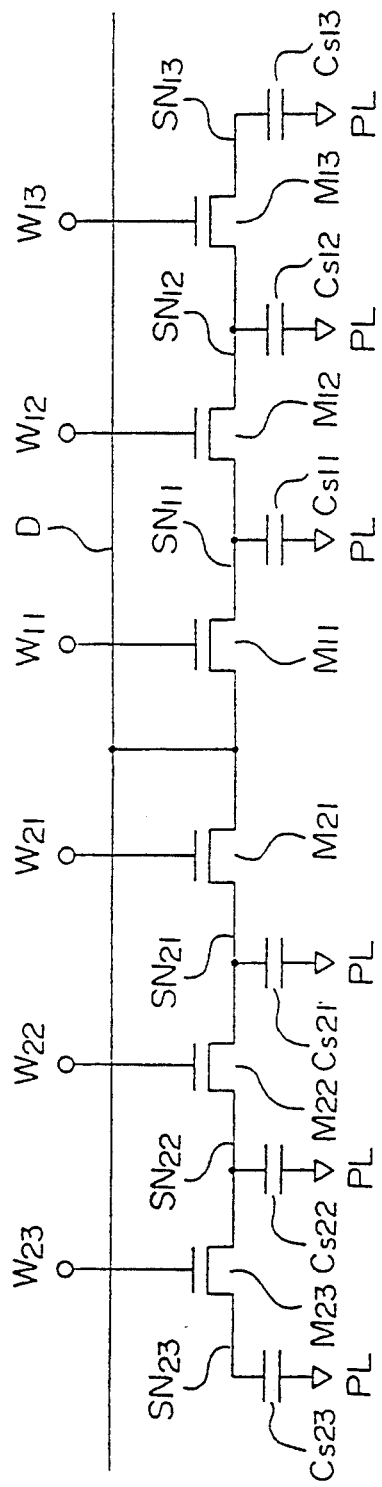
FIG. 12C is an equivalent circuit diagram showing the same example shown in FIG. 11.

FIGS. 12A, 12B and 12C are respectively a cross sectional view, a plan view and an equivalent circuit diagram showing an example of the arrangement of the memory cell block MCB. In these figures, there are shown two memory cell blocks MCB (in the plan view, four MCB) each being made up of three transistors M and three storage capacitors Cs. The cross sectional view is taken on the line A—A' of the plan View.

In those figures, the reference symbol W ($W_{11}$ etc.) designates the word-line, the reference symbol SN ($SN_{11}$ etc.) designates the storage electrode, the reference symbol PL designates the plate electrode, and the reference symbol D designates the data-line. These elements are, for example, made up of a first polysilicon layer, a second polysilicon layer, a third polysilicon layer and aluminium, respectively. The reference symbol CI designates an insulating film for a capacitor which is, for example, made of silicon oxide ($SiO_2$) or a multiple layer film consisting of silicon oxide and silicon nitride ($Si_3N_4$). An n-channel MOS transistor M is arranged in such a way as to have the intersecting portion between the word-line W and an active area as its gate. The storage capacitor Cs is made up of the insulating film CI for a capacitor, the storage node SN and the plate electrode PL between which CI is sandwiched. The $n^+$ region as the drain of the MOS transistor M and the data-line D are connected to each other through the connection hole DCNT. Moreover, the $n^+$ region as the source of the MOS transistor M and the storage node SN are connected to each other through the connection hole MCNT. This memory cell block can be manufactured by the same process as that of the prior art STC cell.

The connection hole DCNT is shared between two memory cell blocks. Thus, since to one connection hole DCNT are connected 2n memory cells, the number of the connection holes DCNT may be reduced to one n-th as compared with the prior art DRAM cell. Moreover, the separation between the adjacent memory cells is performed by the MOS transistor acting as the switch. From those reasons, with the memory cell block in which n memory cells are connected to one another in a cascade manner, the length along the data-line is short and the area is small as compared with the case where the n memory cells of the prior art DRAM are arranged. Moreover, the length of the data-line is short and the stray capacitance of the data-line is decreased.

NINTH EMBODIMENT

Figure 13A:
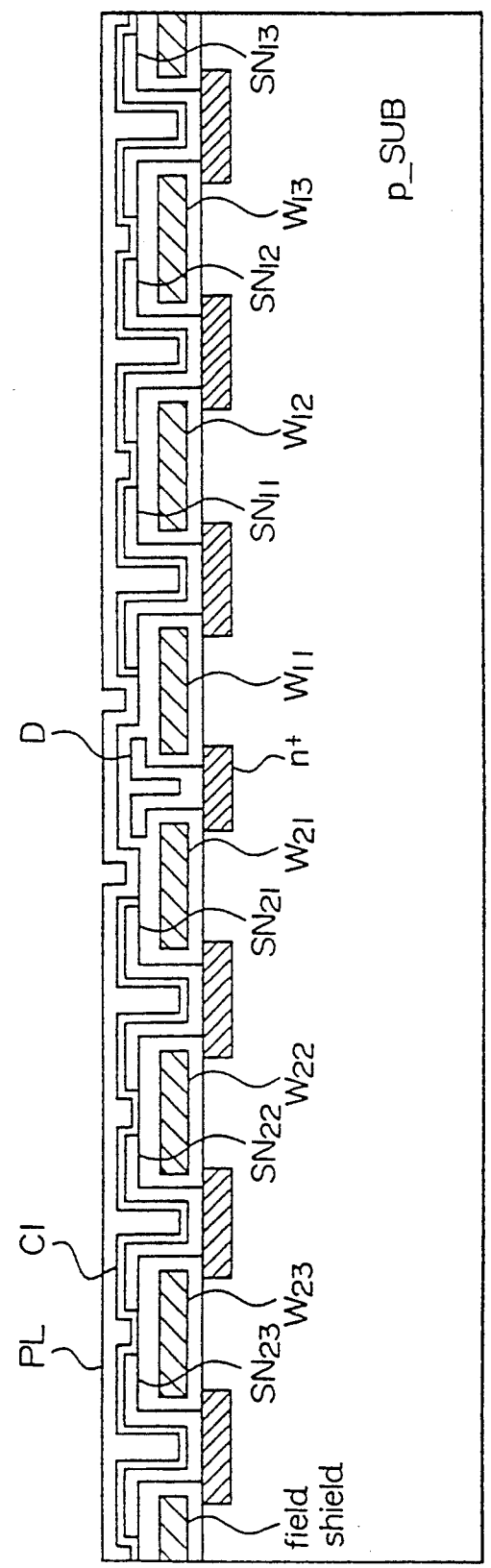
FIG. 13A is a cross sectional view showing a further example of the arrangement of the memory cell block.
Figure 13B:
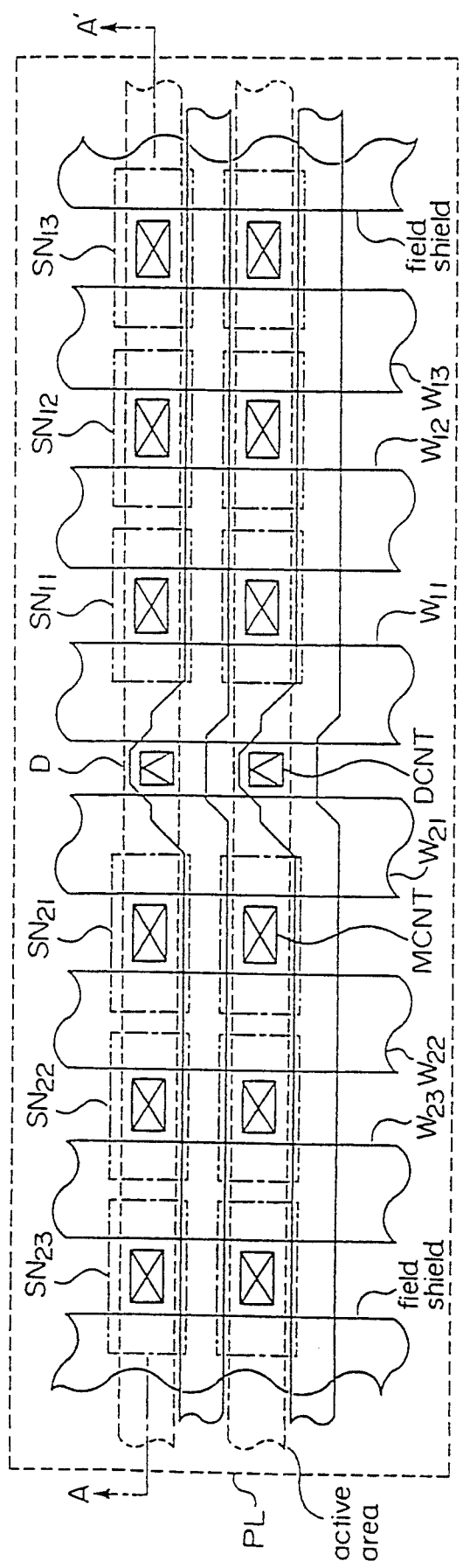
FIG. 13B is a plan view of the same example shown in FIG. 13A.

FIGS. 13A and 13B are respectively a cross sectional view and a plan view showing a further example of the arrangement of the memory cell block MCB. The memory cell in which the data-line is shielded by the plate electrode is proposed in an article of IEEE Trans. Electron Devices, Vol. 37, pp. 737-743, 1990. In the present example, such memory cells are connected to one another in a cascade manner to construct the memory cell block MCB. The cross sectional view shown in FIG. 13A is taken on the line A—A' of the plan view shown in FIG. 13B. The equivalent circuit is the same as that shown in FIG. 12C.

The word-line W and the data-line D are made of polysilicon, silicide or the like. The storage electrode SN is made of silicide or the like. The insulating film CI for a capacitor is made of high melting point metal oxide such as $SiO_2$, $Si_3N_4$ or $Ta_2O_5$, or a multiple layer film thereof The plate electrode PL is made of metal such as polysilicon or tungsten.

The vertical relationship between the plate electrode PL and the storage node SN, and the data-line D is reversed to that of FIG. 12. The data-line D is shielded by the plate electrode PL and the capacitance between the data-lines is small. Therefore, when the signal is read out from the storage capacitor to the data-line, the signal voltage read to the data-line is free from the influence of the potential change of the adjacent data-line. That is, the influence of the data-line interference noise becomes small. As a result, it is possible to perform the reading operation at a high signal to noise ratio.

TENTH EMBODIMENT

Figure 14A:
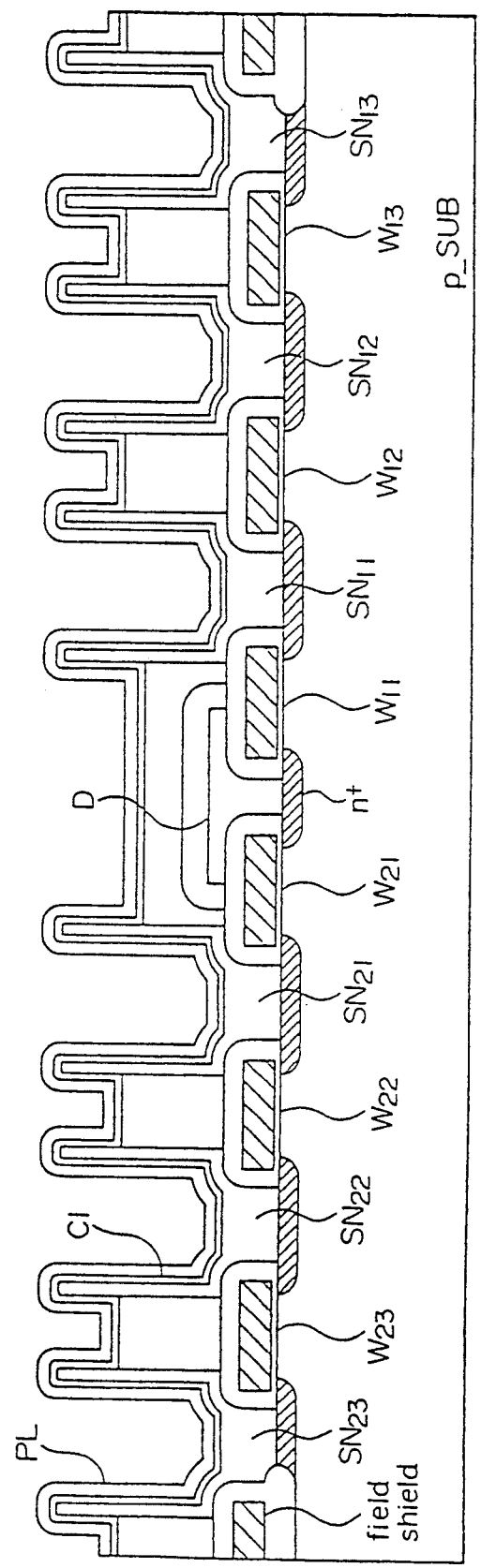
FIG. 14A is a cross sectional view showing an even further example of the arrangement of the memory cell block.
Figure 14B:
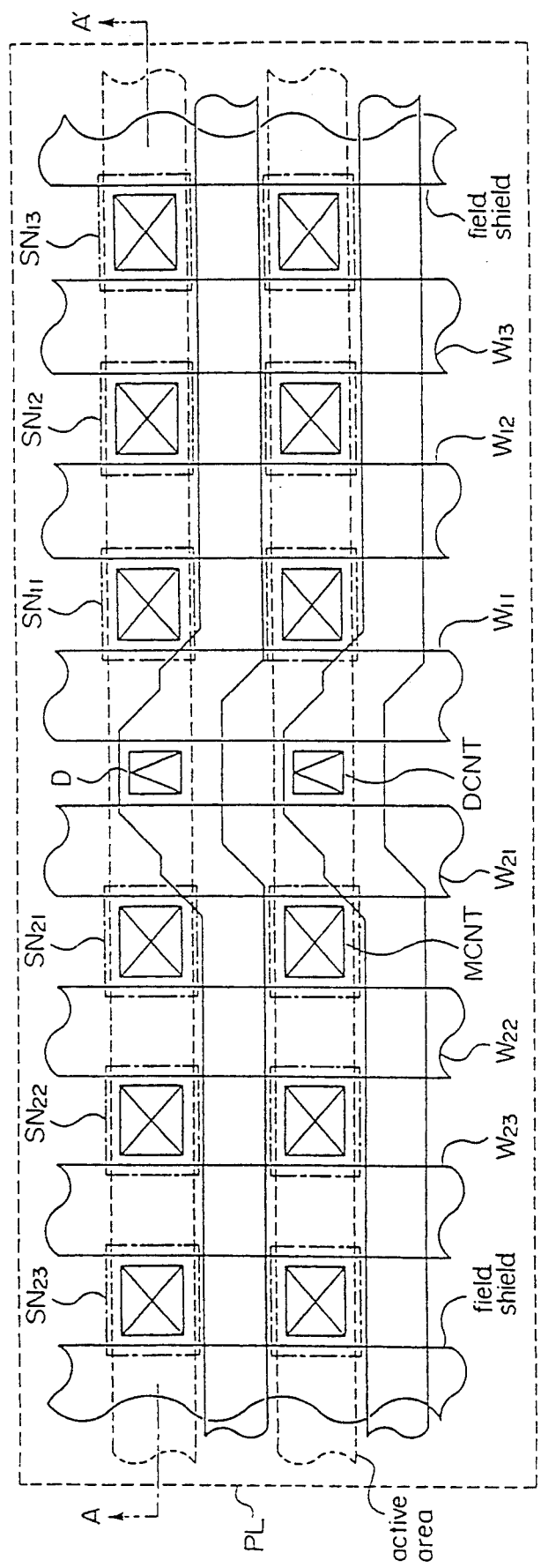
FIG. 14B is a plan view of the same example shown in FIG. 14A.

FIGS. 14A and 14B are respectively a cross sectional view and a plan view showing an even further example of the arrangement of the memory cell block MCB. The memory cell employing a crown-shaped stacked capacitor is proposed in an article of IEEE Trans. Electron Devices, Vol. 38, pp. 255-261, 1991. In the present example, such memory cells are connected to one another in a cascade manner to construct the memory cell block MCB. The cross sectional view shown in FIG. 14A is taken on the line A—A' of the plan view shown in FIG. 14B. The equivalent circuit is the same as that shown in FIG. 12C.

The word-line W and the data-line D are made of polysilicon, silicide or the like. The storage node SN is made of polysilicon or the like. The insulating film CI for a capacitor can be made of high melting point metal oxide such as $SiO_2$, $Si_3N_4$, $Ta_2O_5$, or a multiple layer film thereof. The plate electrode PL is made of metal such as polysilicon or tungsten.

According to the present invention, since a connection hole between the diffusion region and the data-line may be formed every memory cell block and no isolation region is required between the memory cells which are connected to each other in a cascade manner, the area of the memory cell becomes small. Correspondingly, the plane area of the storage capacitor also becomes small. However, since the crown-shaped stacked capacitor is employed, the side area of the storage node is large and it is possible to keep a sufficient capacitance value.

In FIG. 12 through FIG. 14, there are shown examples in each of which the storage capacitor Cs in the memory cell block MCB is constructed by the stacked capacitor which is stacked on the word-line W. However, the arrangement of the memory cell block of the present invention is not limited thereto or thereby. For example, even if the trench capacitor is employed as the storage capacitor Cs which is discussed as the storage capacitor of DRAM in an article of 1982 IEDM Digest of Technical Papers, pp. 806-808, it is possible to construct the memory cell block MCB of the present invention.

ELEVENTH EMBODIMENT

Figure 15:
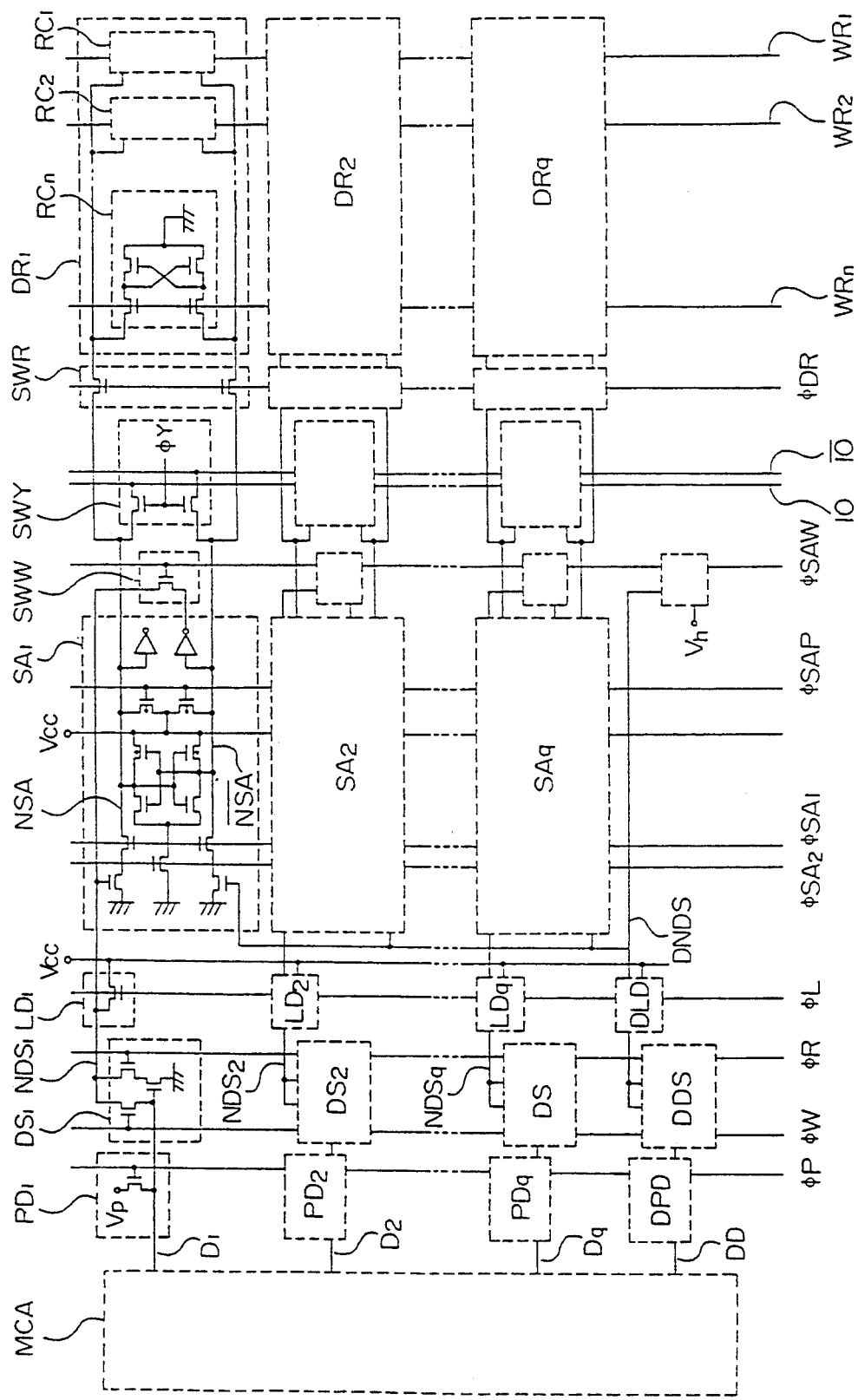
FIG. 15 is a circuit diagram showing the arrangement of an embodiment in which a dummy data-line is shared among a plurality of sense means.

FIG. 15 is a block diagram showing the arrangement of a concrete embodiment which is arranged on the basis of the embodiment shown in FIG. 6. In the present embodiment, by using the register circuit DR, the operation for the memory cell block MCB in the memory cell array MCA is performed. In order to eliminate the noise occurring in the data-lines D ($D_1$, $D_2$, ..., and $D_q$), a dummy data-line DD is provided so that the signal provided on the data-lines D is sensed using a difference between that signal and the reference signal provided on the dummy data-line DD. The dummy data-line DD producing the reference signal is shared among a plurality of data-lines thereby to reduce the area. A plurality of memory cell blocks MCB are connected to each of the q data-lines $D_1$, $D_2$, ..., and $D_q$, and one dummy data-line DD to construct the memory cell block MCB shown in FIG. 11. Then, the memory cell array MCA connected to the dummy data-line DD is referred to as "the dummy cell block DCB". The dummy cell block DCB has the same arrangement as that of the memory cell block MCB, and the storage capacitor DCs has the same capacitance value as that of the storage capacitor Cs in MCB. Moreover, the dummy cell blocks DCB are made to correspond to the memory cell blocks MCB of each of the data-lines and are controlled by the same word-line. The dummy data-line requires a substantially intermediate potential between the potential provided on the data-line when the electric charge corresponding to the information of "1" stored in the storage capacitor Cs in the memory cell block MCB is read out, and the potential provided on the data-line in the case of the presence of such information of "0". This is realized in such a way that the intermediate potential (Vcc/2) between the potential Vcc of "1" and the potential 0V of "0" is stored in advance in the storage capacitor DCs.

The data-lines D are connected to the input terminals NDS ($NDS_1$ etc.) of the sense means SA ($SA_1$ etc.) by the signal transfer means DS ($DS_1$ etc.). The load circuit LD ($LD_1$ etc.) are connected to the terminal NDS. Moreover, the output terminal of the sense means SA is connected to the terminal NDS by the switch SWW. On the other hand, the dummy data-line DD is connected to the input terminal DNDS of the reference signal which is common to a plurality of sense means SA by the signal transfer means DDS. In the same manner as in the terminal NDS, to the terminal DNDS is connected the load circuit DLD. Moreover, the load circuit DLD is connected to the power source of the intermediate voltage Vh (=Vcc/2) by the switch SWW. The terminals NSA and $\overline{NSA}$ of the sense means SA are connected to the register circuits DR ($DR_1$ etc.) by the switch SWR and are connected to a pair of input-output lines IO and $\overline{IO}$ by the switch SWY. The register circuits DR have the same storage capacity of n bits as that of the memory cell block MCB, constructed by four-transistor memory cells RC ($RC_1$ through $RC_n$) and are controlled by the selection lines WR ($WR_1$ through $WR_n$). Moreover, the data-lines D and the dummy data-line DD have the precharge circuits PD ($PD_1$ etc.) and DPD connected thereto, respectively and are precharged to the precharge voltage Vp.

Figure 16A:
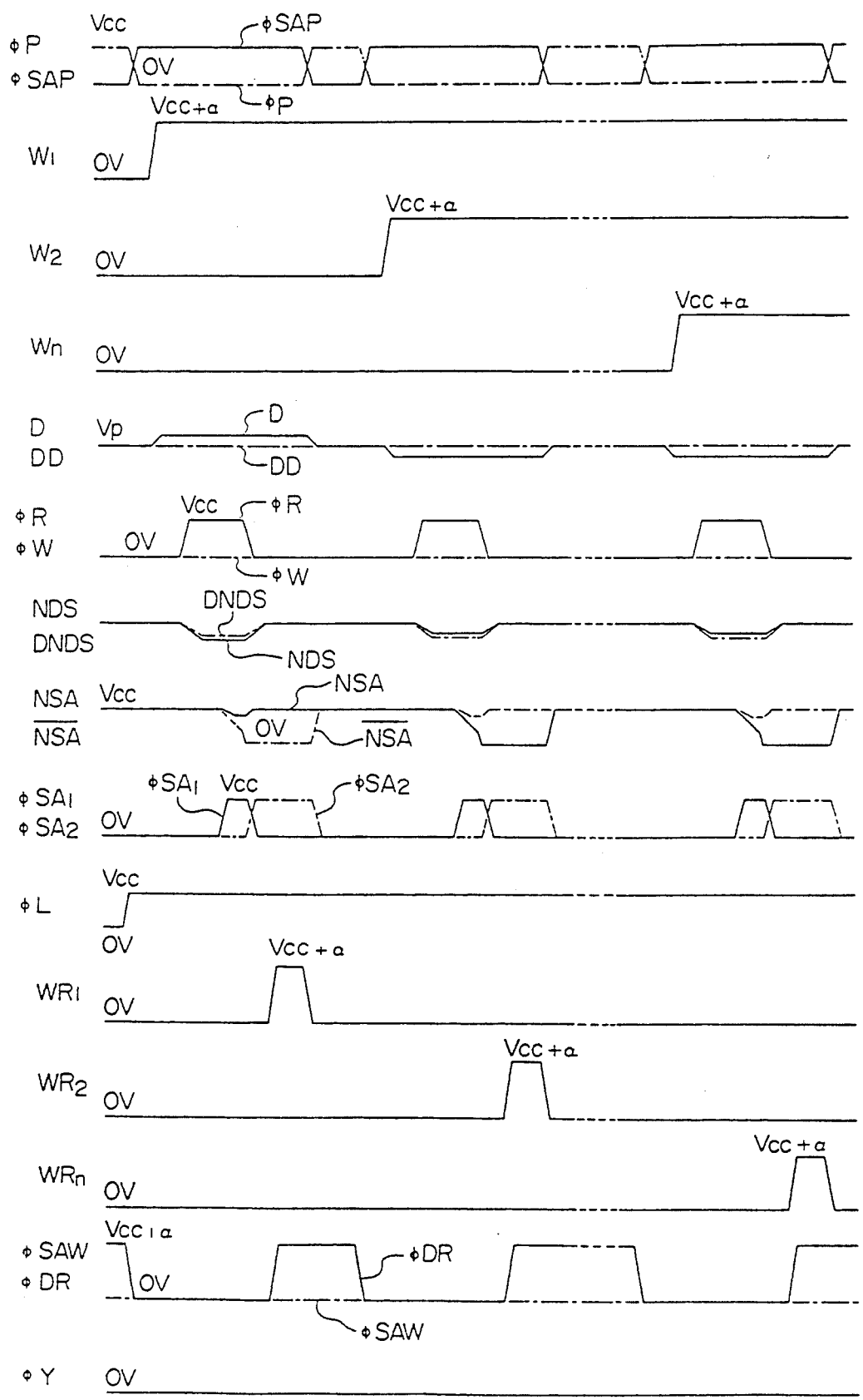
FIG. 16A is a waveform diagram showing operation of the circuit shown in FIG. 15 in reading out information.
Figure 16B:
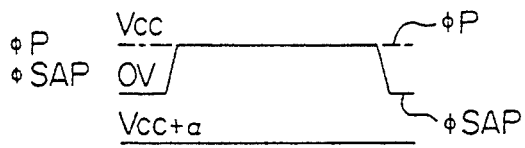
FIG. 16B is a waveform diagram showing operation of the same circuit of FIG. 15 in transferring data.
Figure 16B:
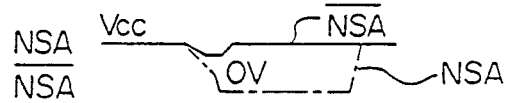
Figure 16B:
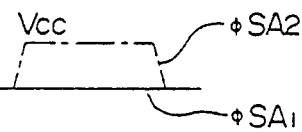
Figure 16B:
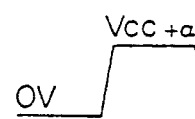

By using the operation waveforms shown in FIGS. 16A, 16B and 16C, the operation of the circuit shown in FIG. 15 will be described in the following manner. First, the description will be given with respect to the operation of reading out the information from the memory cell block MCB on referring to FIG. 16A. In the same manner as in the embodiment shown in FIG. 11, the electric charge accumulated in the storage capacitor Cs in the memory cell block MCB is read out to the data-line D in a time series manner. In FIG. 16A, there is shown the case where "1" and "0" are alternately stored in the storage capacitors in such a way that "1", "0", . . . , and "0" are respectively stored in $Cs_1$, $Cs_2$, . . . , and $Cs_n$. Moreover, the precharge voltage Vp is set to Vcc/2.

In advance, each of the control pulses $\phi R$ and $\phi W$ is made to be at a low potential, the signal transfer means DS and DDS are turned OFF, the capacitor of the sense means SA is electrically separated from the data-line D, and the data-line D and the dummy data-line DD are precharged to the precharge voltage Vp by the precharge circuits DD and DPD. Moreover, in advance, the control pulse $\phi L$ is set to Vcc and the load circuits LD and DLD are made to be in the conduction state. Further, in advance, the control pulse $\phi SAP$ is set to the low potential, and each of the terminals NSA and $\overline{NSA}$ in the sense means SA is precharged to Vcc, and also the control pulse $\phi DR$ is set to the high potential (Vcc+$\alpha$) to turn the switch SWR on and the register circuit DR is precharged.

Then, the control pulse $\phi DR$ is set to the low potential to turn the switch SWR OFF thereby to electrically separate the stray capacitance of the register circuit DR from the sense means SA. Moreover, the control pulse $\phi SAP$ is set to Vcc, and the control terminals NSA and $\overline{NSA}$ in the sense means SA, and the data-line and the dummy data-line are made to be in the floating state.

Thereafter, the word-line $W_1$ of one row of the memory cell blocks in the plurality rows of memory cell blocks MCB is raised to the high potential (Vcc+$\alpha$) to turn the MOS transistor $M_{11}$ on so that the electric charge accumulated in the storage capacitor $Cs_1$ is read out to each of the data-lines D ($D_1$, $D_2$, . . . , and $D_q$). The potential change of the data-line D due to the electric charge thus read makes the control pulse $\phi R$ be Vcc and is then sensed by the signal transfer means DS to be converted into a current The resultant current is caused to flow from the power source voltage Vc through the load circuit LD. As a result, the signal transfer means DS acts as a common source amplifier having the load circuit LD as the load and at the terminal ND, the output corresponding to the potential change of the data-line D is produced. Thus, the output produced at the terminal NDS every data line is inputted to the sense means SA. At this time, the stray capacitance of the data-line D and that of the sense means SA are electrically separated from each other by the signal transfer means SD. Thus, it is possible to increase the potential change of the data-line D when reading out the information from the storage capacitor Cs. That is, it is possible to perform the reading operation at a high signal to noise ratio.

Simultaneously, with respect to the dummy cell block DCB as well, the same operation as in the above case is performed, so that the electric charge is read out from the storage capacitor DCS to the dummy data-line DD. Moreover, the voltage corresponding to the potential of the dummy data-line DD is outputted to the terminal DNDS to be inputted to each of the plurality of sense means SA in the form of a reference voltage. The reference voltage produced at DNDS is an intermediate voltage between the signal voltage produced at the terminal NDS when the information read out from the storage capacitor Cs in the memory cell block MCB is on the level of "1", and the signal voltage produced at the terminal NDS when such information is on the level of "0".

Subsequently, the control pulse $\phi SA_1$ is raised to Vcc to make the sense means SA act as a differential amplifier having the latch circuit of the PMOS transistor as the load. Then, after the magnitude of the signal voltage produced at the terminals NSA and $\overline{NSA}$ become sufficiently large, the control pulse $\phi SA_1$ is reduced and the control pulse $\phi SA_2$ is raised to make the sense means SA operate as a flip-flop type differential amplifier thereby to amplify the difference between the terminals NSA and $\overline{NSA}$ up to Vcc. At this time, since the amplified signal is not fedback to the terminals NDS and DNDS, it is possible to apply the reference signal to the plurality of sense means SA. Since the data-line D is kept being in the floating state and the potential thereof is not changed, there is no problem of the data-line interference noise due to the amplification of the signal.

Then, after the signals produced at the terminals NSA and $\overline{NSA}$ are transferred to the register circuit DR by turning the switch SWR on and are written to the four-transistor memory cell $RC_1$ by raising the selection-line $WR_1$ to the high potential (Vcc+$\alpha$), these signals are stored therein by reducing the selection-line $WR_1$ to the low potential. Thereafter, with the MOS transistor $M_1$ and the switch SWR in the memory cell block MCB being turned on, the control pulse $\phi SA_2$ is reduced, the control pulse $\phi P$ is raised to Vcc and the control pulse $\phi SAP$ is reduced to the low potential so that the data-line D, the dummy data-line, the sense means SA and the register circuit DR are precharged. At this time, the control pulse $\phi R$ is reduced to the low potential and the signal transfer means DS and DDS are turned off.

Subsequently, after the switch SWR is turned off, the control pulse $\phi P$ is reduced to the low potential and the control pulse $\phi SAP$ is raised to Vcc, in addition to the word-line $W_1$, the word-line $W_2$ is raised to the high potential so that the electric charge accumulated in the storage capacitor $Cs_2$ in each of the memory cell blocks MCB is read out to each of the datalines D. Then, in the same manner as in the reading of the electric charge accumulated in the storage capacitor $Cs_1$, that electric charge thus read is inputted to the sense means SA through the signal transfer means DS and the load circuit LD and the amplified information is stored in the 4 transistor memory cell $RC_2$ in the register circuit DR. Thereafter, in the similar manner, the word-line is raised to the high potential one by one so that the electric charge accumulated in the storage capacitor Cs is read out to the data-line D in sequence to be inputted to the sense means SA through the signal transfer means DS and the load circuit LD and the amplified information is stored in the register circuit DR. The electric charge is finally read out from the storage capacitor Csn to complete the reading operation with respect to one memory cell block MCB.

By accessing the information which was read out from the memory cell block MCB in a manner as described above to the register circuit DR, the inputting or outputting operation is performed. It is possible to randomly access to the register circuit DR. In this case, on referring to FIG. 16B, the description will hereinbelow be given with respect to the operation of outputting the information stored in the storage capacitor $Cs_1$ in the memory cell block MCB to the external side. Since that information is stored in the four-transistor memory cell $RC_1$ in the register circuit DR, it will be read out. First, the control pulse $\phi SAP$ is raised from the low potential to Vcc, and the terminals NSA and $\overline{NSA}$ are made to be in the floating state. Then, the potential of the selection-line $WR_1$ is raised to $(Vcc+\alpha)$ to read out the information from the four-transistor memory cell $RC_1$. That is, the current is caused to flow from the terminals NSA and NSA to the four transistor memory cell $RC_1$ to produce a potential difference between the terminals NSA and $\overline{NSA}$. The control pulse $\phi SA_2$ is raised to Vcc to make the sense means SA act as a flip-flop type differential amplifier thereby to amplify the signal corresponding to the potential difference. After deciding the information, the control pulse $\phi Y$ is raised to turn the switch SWY on thereby to output the information to the pair of input-output lines IO and $\overline{IO}$ in the form of a differential signal. At this time, the selection-line $WR_1$ is reduced to 0V to restore the information in the four-transistor memory cell $RC_1$. Thereafter, the control pulse $\phi Y$ and $\phi SA_2$ are reduced to 0V to turn the switch SWY and the sense means SA off and the control pulse $\phi SAP$ is reduced to 0V to precharge both the terminals NSA and $\overline{NSA}$.

The information amplified by the sense means SA is rewritten as the information transferred through the pair of input-output lines IO and $\overline{IO}$ from the externals of the chip to perform the writing operation.

Figure 16C:
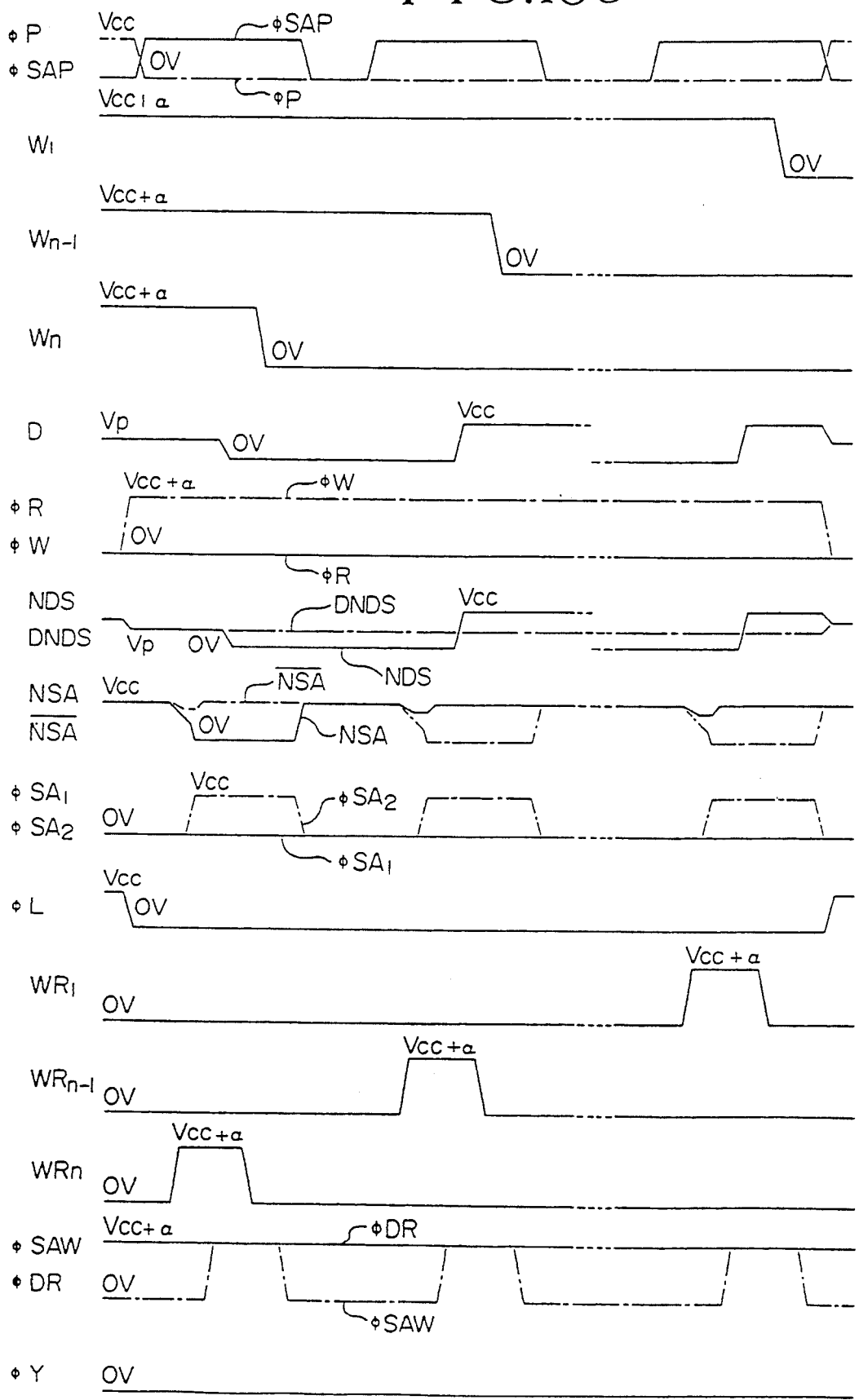
FIG. 16C is a waveform diagram showing operation of the same circuit of FIG. 15 in restoring the data.

After the above-mentioned operation required for the register storage means DR is repeated by the necessary times, the information read out from the memory cell block MCB is restored in the reverse order of the reading operation in accordance with the operation waveforms shown in FIG. 16C. FIG. 16C is a time chart showing the restore operation after "1" and "0" are alternately read out in such a way that "1", "0", ..., and "0" are respectively read out from $Cs_1$, $Cs_2$, ..., and $Cs_n$.

First, the control pulse $\phi L$ is reduced from Vcc to 0V to make the load circuits LD and DLD be in the non-conduction state Moreover, the control pulse $\phi W$ is raised to the high potential $(Vcc+\alpha)$ to make each of the signal transfer means DS and DDS act as a switch in the on state thereby to connect the data-line D and the dummy data-line DD to the terminals NDS and DNDS, respectively. The control pulse $\phi DR$ is kept being at the high potential $(Vcc+\alpha)$ and the switch is also kept being in the on state. Then, after the control pulse $\phi SAP$ is reduced to the low potential to precharge the terminals NSA and $\overline{NSA}$, and the register circuit DR, the control pulse $\phi P$ is reduced to the low potential, the control pulse $\phi SAP$ is raised to Vcc, and the data-line D and the terminals NSA and $\overline{NSA}$ are made to be in the floating state.

Then, the selection-line $WR_n$ is raised to $(Vcc+\alpha)$ to read out the signal from the four-transistor memory cell $RC_n$ in the register circuit DR, and the control pulse $\phi SA_2$ is raised to Vcc to amplify the signal thus read out with the sense means SA. After deciding the information, the selection-line $WR_n$ is reduced to 0V. The control pulse $\phi SAW$ is raised to $(Vcc+\alpha)$ to turn the switch SWW on so that the output of the sense means SA which is inverting-amplified by the inverter is transferred to the memory cell block MCB through the signal transfer means DS and the data-line D, and the word-line Wn is reduced to 0V to restore 0V corresponding to the information of "0" in the storage capacitor $Cs_n$. At the same time, the intermediate voltage Vh $(=Vcc/2)$ is transferred to the dummy data-line DD to be stored in the storage capacitor DCsn in the dummy cell block DCB. At this time, the stray capacitance of the data-line D is electrically separated from the terminal $\overline{NSA}$ by the inverter, and thus, there is no possibility that the information decided by the sense means SA is inverted Incidentally, the inverter in which its input terminal is connected to the terminal NSA and its output is open is used for balancing the stray capacitances with each other by NSA and $\overline{NSA}$.

Thereafter, the control pulse $\phi SAW$ is reduced to 0V to make both the terminal NDS and the data-line D be in the floating state, and the control pulse $\phi SA_2$ is reduced to 0V and further the control pulse SAP is reduced to 0V to precharge both the terminals NSA and $\overline{NSA}$. Then, after the control pulse $\phi SAP$ is again raised to make both the terminals NSA and $\overline{NSA}$ be in the floating state, the information which was read out from the storage capacitor $Cs_{n-1}$ to be stored in the four-transistor memory cell $RC_{n-1}$ in the register circuit DR is read out therefrom by raising the selection-line $WR_{n-1}$ to $(Vcc+\alpha)$ and is amplified with the sense means SA by raising the control pulse $\phi SA_2$ to Vcc to be restored. At the same time, the intermediate voltage Vh $(=Vcc/2)$ is stored in the storage capacitor DCs. In the similar manner, the information stored in the four-transistor memory cell RC in the register circuit DR is read out in the reverse order of the reading operation to be restored.

The above writing operation is, when reading out the information from the register circuit DR, performed by electrically separating the data-line capacitance from the sense means SA. Therefore, since the potential of the data-line D does not take part in the reading of the information from the register circuit DR, there is no necessity of precharging the data-line D. Therefore, when storing "1" or "0" successively, the voltage of the data-line D may not be changed. As a result, the power consumption can be greatly reduced.

The description has hereinabove given with respect to the operation of accessing to the register circuit DR to transfer the signal between the memory cell block and the external side during the period from the time when the information is read out from the memory cell block MCB to be stored in the register circuit up to the time when the restore operation is started. As for another operation, as described with respect to the embodiment shown in FIG. 6, such an operation may be useful that the information of the storage capacitor $Cs_n$ which is finally read out from the memory cell block is not stored in the register circuit DR but is restored in the original memory cell block MCB. For example, the information is read out from the desired storage capacitor Cs to be amplified by the sense means SA and under this condition, the switch SWY is turned on to output the information to the pair of input-output lines IO and $\overline{IO}$ in the form of a differential signal, whereby the reading operation can be performed. The writing operation is performed in such a way that the information written from the external side of the chip to the pair of input-output lines IO and $\overline{IO}$ is replaced with the information amplified by the sense means SA by turning the switch SWY on. Moreover, while performing the restore operation, it is possible to transfer the information between the memory cell block and the external side. In such an operation, the storage capacity of the register circuit DR may be smaller than that of the memory cell block MCB by one memory cell.

In the embodiment shown in FIG. 15, the dummy data-line DD needs to be arranged in such a way that the noise component which is the same as on the data-line D is generated on the dummy data-line DD. In the detection of the signal, the matching with the data-line must be maintained with respect to the electrical characteristics such as the value of the stray capacitance in such a way that when the selection-line such as the word-line is pulse-driven, the coupling noise thereof to that line is the same. In the present embodiment, the signal of the data-line D is applied to one sense means SA, whereas the reference signal of the dummy data-line DD is applied to the plurality of sense means SA. Thus, the balance may become a problem. However, since the stray capacitance of the input terminal of the sense means SA is electrically separated from both the data-line D and the dummy data-line DD by the signal transfer means DS and DDS, the matching of the capacitance may be maintained between the data-line D and the dummy data-line DD. To the data-line D and the dummy data-line DD are respectively connected the memory cell block MCB and the dummy cell block DCB which are the same in arrangement. The data-line D and the dummy data-line DD are also equal in wiring length to each other. Thus, the matching can be maintained therebetween. Even if a plurality of storage capacitors Cs are connected in parallel to the capacitance of the data-line, the storage capacitor DCs in the dummy cell block DCB has the same capacitance value as that of the storage capacitor Cs of the memory cell block MCB and the same operation is performed in both the capacitors. Therefore, the matching can be maintained.

In the present embodiment, the information is stored in the storage capacitor Cs in the corresponding memory cell block MCB, and at the same time, the intermediate voltage Vh (=Vcc/2) is stored in the storage capacitor DCs in the dummy cell block DCB. Thereafter, the intermediate voltage thus stored is left as it is until the subsequent selection is performed. That is, the electric charge accumulated in the storage capacitor DCs is, in the similar manner to that of the electric charge corresponding to "1" accumulated in the storage capacitor Cs, decreased with time by the leakage current and the like in the storage capacitor portion. Therefore, as compared with the arrangement method of the dummy cell employing the prior art DRAM, e.g., the application of the method of adding a circuit for setting the terminal in the dummy cell to a desired potential to the dummy cell, as described in an article of 1988 IEEE ISSCC Digest of Technical Papers, pp. 234-235, the time required for the information on the high potential side to be decreased to be mistaken in judgement as the information on the low potential side, i.e., the data-holding time can be made to be long. This means that it is possible to make the time interval necessary for refreshing the memory cell block MCB long. Thus, it is possible to decrease the ratio of the time in which the semiconductor memory device executes the refresh operation, and to increase the ratio of the time required for the system to operate the semiconductor memory device. Moreover, the power consumption required for the refresh can be reduced. In addition thereto, since the operation for the memory cell block MCB is the same as the operation for the dummy cell block DCB, the control is simple, the circuit scale therefor is small, and the power consumption is small.

TWELFTH EMBODIMENT

Figure 17:
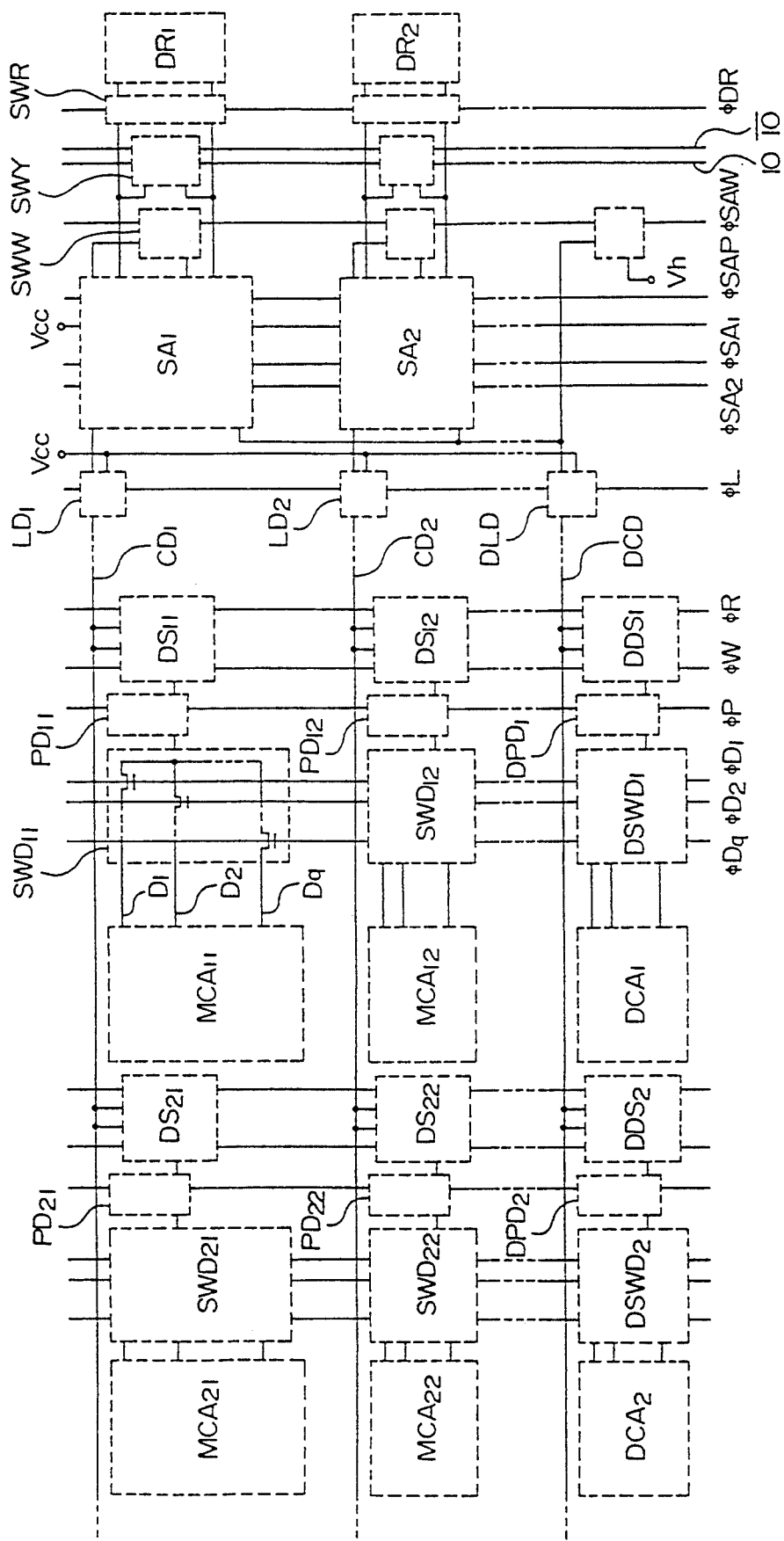
FIG. 17 is a block diagram showing the arrangement of another embodiment in which sense means is shared among a plurality of data-lines.

FIG. 17 is a block diagram showing the arrangement of a further concrete embodiment of the present invention The present embodiment is an example wherein the signal transfer means DS, the load circuit LD, the sense means SA, the switches SWY and SWR, the register circuit DR and the like are shared among the plurality of data-lines D (in the figure, the number thereof is q) thereby to reduce the chip area and to relieve the layout pitch of those circuits. The signals which are simultaneously read out to the plurality of data-lines are switched over by the switches SWD (SWD$_{11}$ etc.) to be inputted to the respective sense means SA in a time series manner to perform the discrimination, thereby to share the sense means SA and the like. Moreover, as in the embodiment shown in FIG. 5, the global data-lines CD (CD$_1$, CD$_2$ etc.) are provided in parallel to the data-lines D, the signals are transferred to or from the data-lines through the signal transfer means DS (DS$_{11}$, DS$_{21}$ etc.), and the sense means SA and the like are shared among the plurality of memory cell arrays MCA (MCA$_{11}$, MCA$_{21}$ etc.). By the two techniques, the sense means SA and the like are shared among the plurality of data-lines D disposed in a matrix arrangement. Thus, it is possible to decrease the occupation area ratio of the sense means SA and the like.

The q data-lines $D_1, D_2, \ldots,$ and $D_q$ of the memory cell array MCA are connected to the signal transfer means DS through the switch SWD. The precharge circuits PD (PD$_{11}$ etc.) are connected to the connection terminals between the switches SWD and the signal transfer means DS. The dummy cell arrays DCA (DCA$_1$ etc.) have the same arrangement as that of the memory cell arrays MCA and are connected to the signal transfer means DDS (DDS$_1$ etc.) through the switches DSWD (DSWD$_1$ etc.). Moreover, the global dummy data-line DCD is provided with a plurality of dummy cell arrays DCA. In FIG. 17, the memory cell array MCA, the precharge circuit PD, the signal transfer means DS, the load circuit LD, the sense means SA, the switches SWW, SWY and SWR, and the register circuit DR are the same in arrangement as those in FIG. 11. Incidentally, the register circuit DR has the storage capacity of (q×n) bits and is made up of (q×n) cells of four-transistor memory cells RC.

Figure 18A:
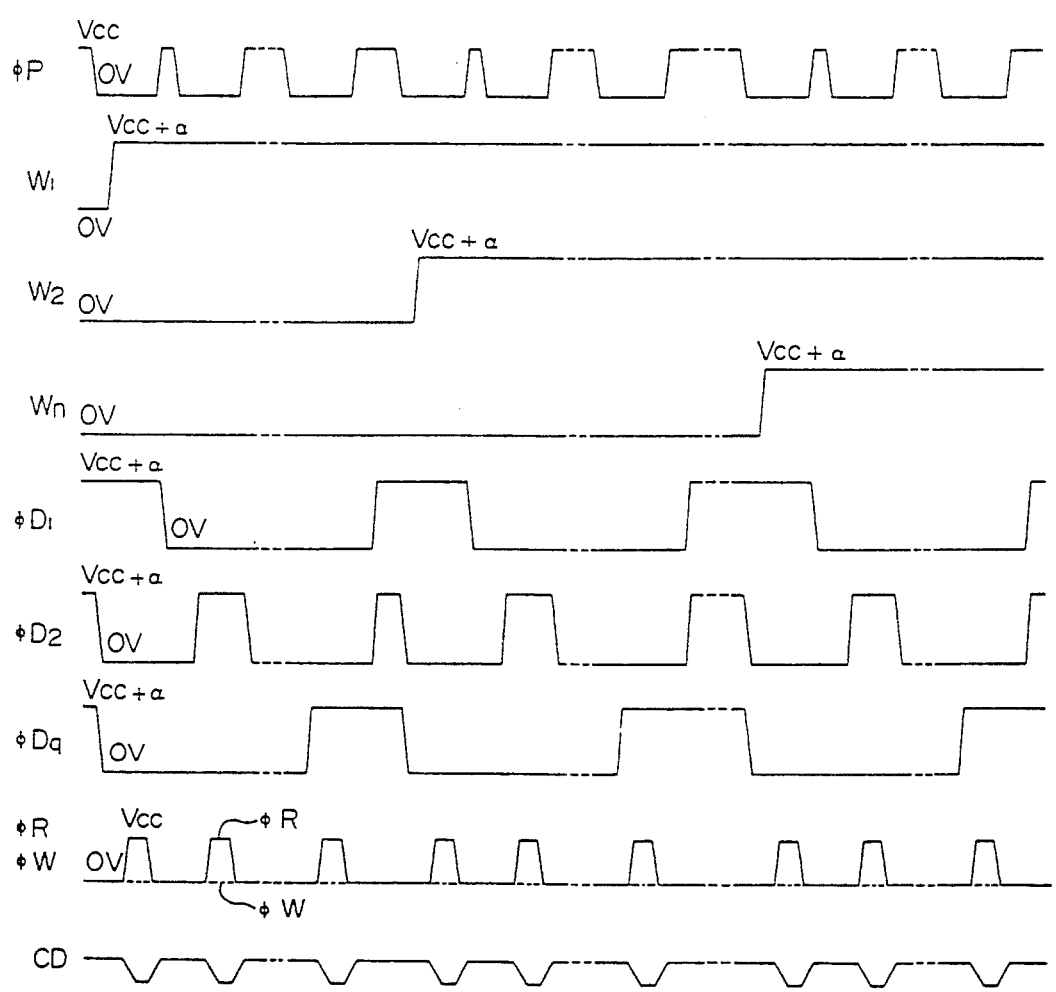
FIG. 18A is a waveform diagram showing operation of the same circuit of FIG. 17 in reading out data.

The reading operation of the present embodiment will be described on referring to FIG. 18A. Since the load circuit LD, the sense means SA, the switches SWW, SWY and SWR, and the register circuit DR are the same in operation as those of the embodiment shown in FIG. 15, the waveforms of the signals with respect to those elements are omitted in FIG. 18A and the description thereof is also omitted herein. First, in the stand-by state, the control pulse $\phi P$ is raised to Vcc to operate the precharge circuit PD, and all the control pulses $\phi D_1, \phi D_2, \ldots,$ and $\phi D_q$ of the switches SWD are raised to the high potential (Vcc+α) to turn all the switches SWD on to precharge the data-lines $D_1, D_2, \ldots,$ and $D_q$ in each memory cell array MCA to the precharge voltage Vp. Subsequently, the control pulses $\phi P$ and $\phi D_2, \ldots,$ and $\phi D_q$ are reduced to 0V to make the data lines $D_1, D_2, \ldots,$ and $D_q$ be in the floating state. Then, out of a plurality row of memory cell arrays MCA, for example, one row of memory cell arrays MCA$_{11}$, MCA$_{12}$ etc. is selected and out of a plurality row of memory cell blocks MCB in each of the selected memory cell arrays, one row of memory cell blocks is selected. The data line $W_1$ of the each of the selected memory cell blocks is raised to the high potential (Vcc+α) so that the electric charge is read out from the storage capacitor Cs$_1$ of each memory cell block MCB to each data-line of each memory cell block. At this time, the control pulse $\phi D_1$ is kept being in the high potential thereby to transfer the signal produced on the data-line $D_1$ of each memory cell block to the signal transfer means DS. This signal is converted into a current by raising the control pulse $\phi R$ to Vcc, so that the current is caused to flow from the load circuit LD through the global data-line CD to input the voltage of the global data-line CD to the sense means SA. In the similar manner, the common reference signal is applied from the dummy data-line DCA$_1$ to a plurality of sense means SA. The sense means SA performs the differential amplification and the resultant output is transferred to the register circuit DR to be stored therein. Next, after the control pulse $\phi D_1$ is reduced to 0V and the connection terminal between the switch SWD and the signal transfer means DS is precharged by the precharge circuit PD, the control pulse $\phi D_2$ is raised to (Vcc+α) to switch over the switch SWD, so that the same operation is performed. Thereafter, such an operation is repeatedly performed up to the control pulse $\phi D_q$, and the signals read out to the respective data-lines $D_1, D_2, \ldots,$ and $D_q$ of each memory cell block are amplified all to be stored in the register circuit DR. Thereafter, to operate the precharge circuit PD thereby to precharge the individual data-lines $D_1, D_2, \ldots,$ and $D_q$. Then, in addition to the word-line $W_1$, the word-line $W_2$ is also raised to (Vcc+α) to read out the information to the associated data-lines, and the control pulses $\phi D_1, \phi D_2, \ldots,$ and $\phi D_q$ are raised to (Vcc+α) in this order so that the signals are sensed by the sense means SA to be stored in the register circuits DR. Such an operation is repeatedly performed up to the word-line $W_n$.

The information which was read out from the memory cell blocks MCB in a manner as described above is accessed to the register circuit DR thereby to perform the reading or writing operation.

Figure 18B:
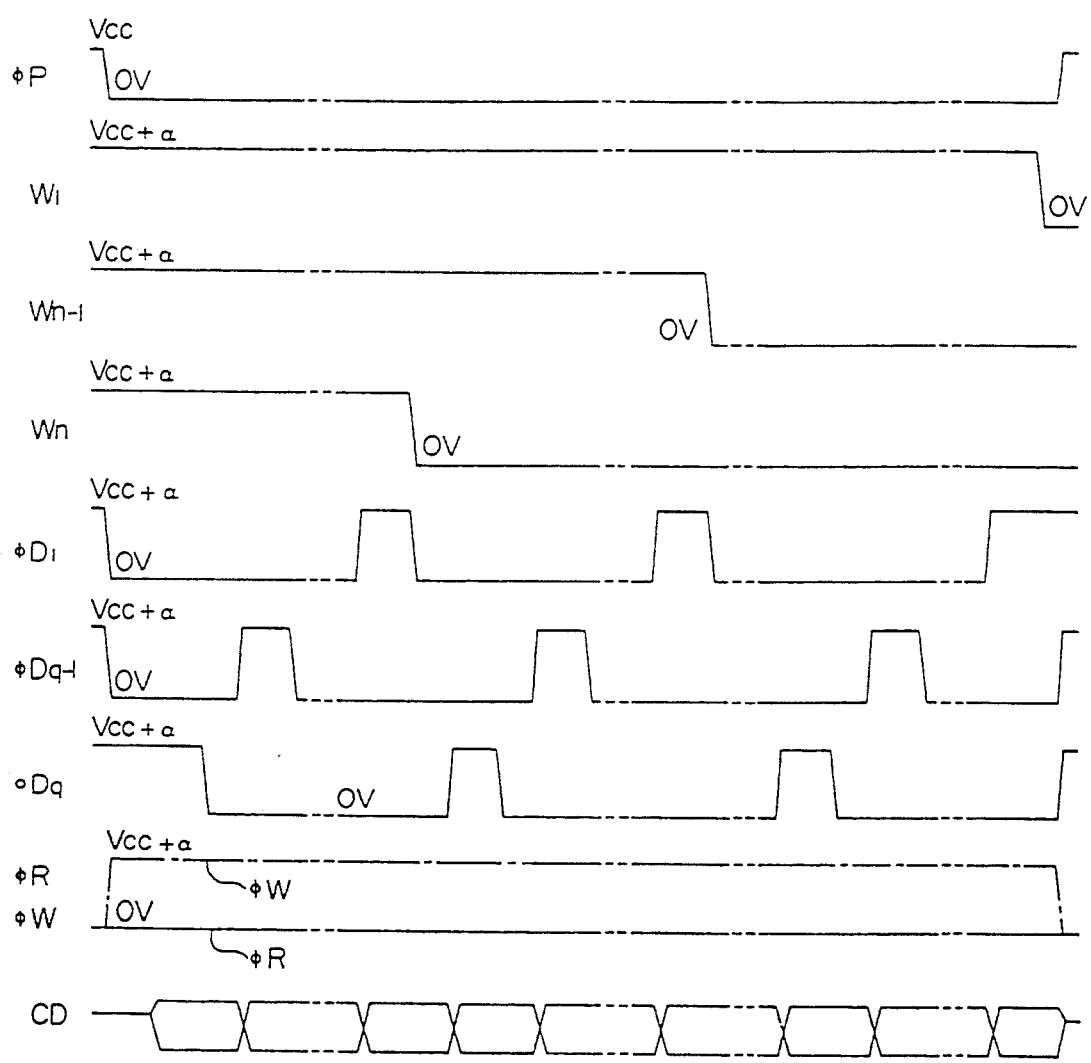
FIG. 18B is a waveform diagram showing operation of the same circuit of FIG. 17 in restoring the data.

The restore operation is performed in the reverse order of the reading operation as shown in the waveforms of FIG. 18B. That is, the control pulses $\phi P$ and $\phi D_1, \phi D_2, \ldots,$ and $\phi D_{q-1}$ are reduced to 0V and the control pulse $\phi W$ is raised to (Vcc+α). With all the word-lines $W_1, W_2, \ldots,$ and $W_n$ being raised, the control pulses $\phi D_q, \phi D_{q-1}, \ldots,$ and $\phi D_1$ are raised in this order to (Vcc+α) so that the desired information is read out from the register circuit DR to be transferred to the data-lines $D_q, D_{q-1}, \ldots,$ and $D_1$ to be stored in the memory cell block MCB by reducing the word-line $W_n$. Such an operation is repeatedly performed in the order of $W_{n-1}, W_{n-2}, \ldots, W_1$. Then, the control pulses $\phi P$ and $\phi D_1, \phi D_2, \ldots,$ and $\phi D_q$ are raised to make the operation return to the stand-by state.

The above-mentioned operation is an operation wherein the information is read out from the q memory cell blocks MCB per global data-line to the register circuit DR to transfer the signal to or from the external side thereby to restore the information in the q memory cell blocks MCB. As for another operation, as described in the embodiment shown in FIG. 6, such an operation may be available that the information which was finally read out from the storage capacitor Csn in each memory cell block is not stored in the register circuit DR but is restored in the original memory cell block MCB. In this case, the storage capacity of the register circuit DR may be $\{q \times (n-1)\}$, so that it is possible to miniaturize the resister circuit DR. In this case, when the signal produced on the data-line is amplified by the sense means SA and the voltage of that data-line is largely changed for the restore operation, the signal before being amplified by the sense means SA is left on the adjacent data-line Therefore, there is the possibility that the data-line interference noise may become a problem in some cases. However, this problem can be avoided by employing the structure having the less data-line interference noise such as the memory cell block in which the data-line shown in FIG. 13 is shield by the plate.

THIRTEENTH EMBODIMENT

Figure 19:
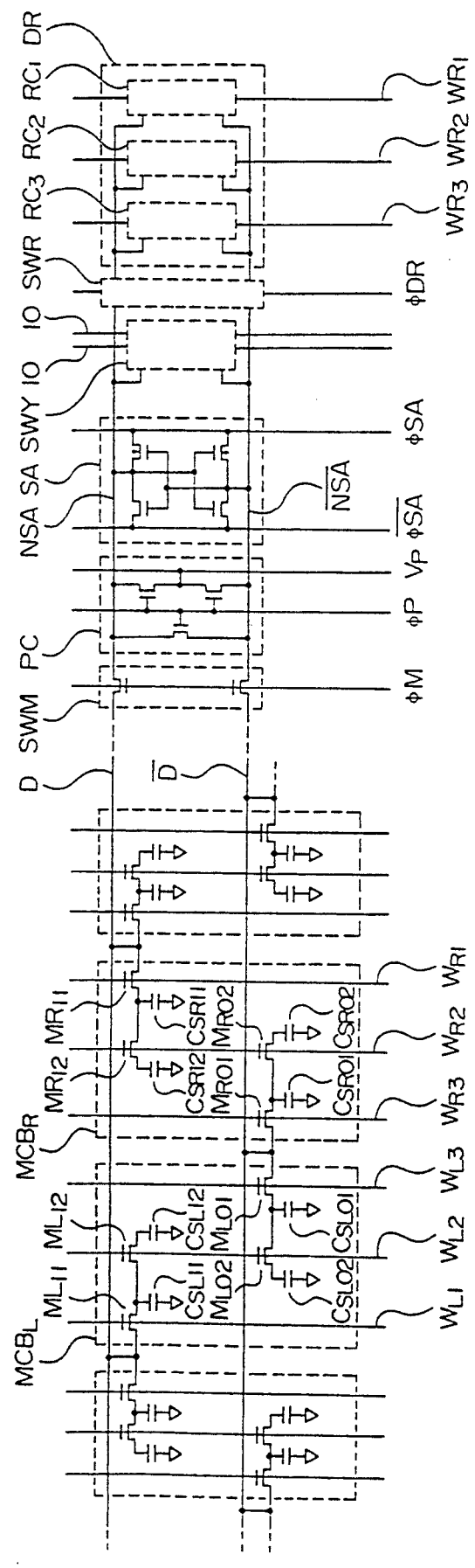
FIG. 19 is a circuit diagram showing the arrangement of still another embodiment employing the folded data-line arrangement.

FIG. 19 is a circuit diagram showing the arrangement of an even further concrete embodiment of the present invention. The present embodiment is arranged in such a way that the signal read out from the memory cell block MCB is amplified by the differential amplifier. Further, there is shown an example in which the data-line is constructed in the folded data-line arrangement with respect to one pair of data-lines in the memory cell array. The MOS transistors M (MR$_{11}$, M$_{L11}$ etc.) and the Storage capacitors Cs (Cs$_{R11}$, Cs$_{L11}$ etc.) are used as the switches and the storage means, respectively to construct the memory cell blocks MCB (MCB$_R$ and MCB$_L$) which are connected to the pair of data-lines D and $\overline{D}$. A connection hole to D is provided opposite to a connection hole to D so as not to read out the electric charge from two storage capacitors Cs to D and $\overline{D}$ simultaneously. In the same manner as in FIG. 4, the connection holes to the data-lines are shared between two memory cell blocks to reduce the area, and therefore, MCB$_R$ having the connection hole to the data-line D provided on the side of the differential amplifier SA, and MCB$_L$ having the connection hole to the data-line D provided opposite thereto are alternately disposed. Moreover, for the purpose of saving the area, two transistors M$_{12}$ and M$_{02}$ (MR$_{12}$, MR$_{02}$, or M$_{L12}$, M$_{L02}$) are controlled by the word-lines $W_2$ (WR$_2$ and W$_{L2}$).

To the pair of data-lines D and $\overline{D}$ are connected through the switch SWM, the differential amplifier SA used as the sense means, and the precharge circuit PC. Moreover, through the switch SWR, to the differential amplifier SA is connected the register circuit DR. Further, the pair of input-output lines IO and $\overline{IO}$ are provided to be connected to the differential amplifier SA through the switch SWY. As the differential amplifier SA, a flip-flop type differential amplifier is employed. The register circuit DR is storage means which is capable of storing therein 3 bits per pair of data-lines and is made up of four-transistor memory cells RC (RC$_1$ etc.).

Figure 20B:
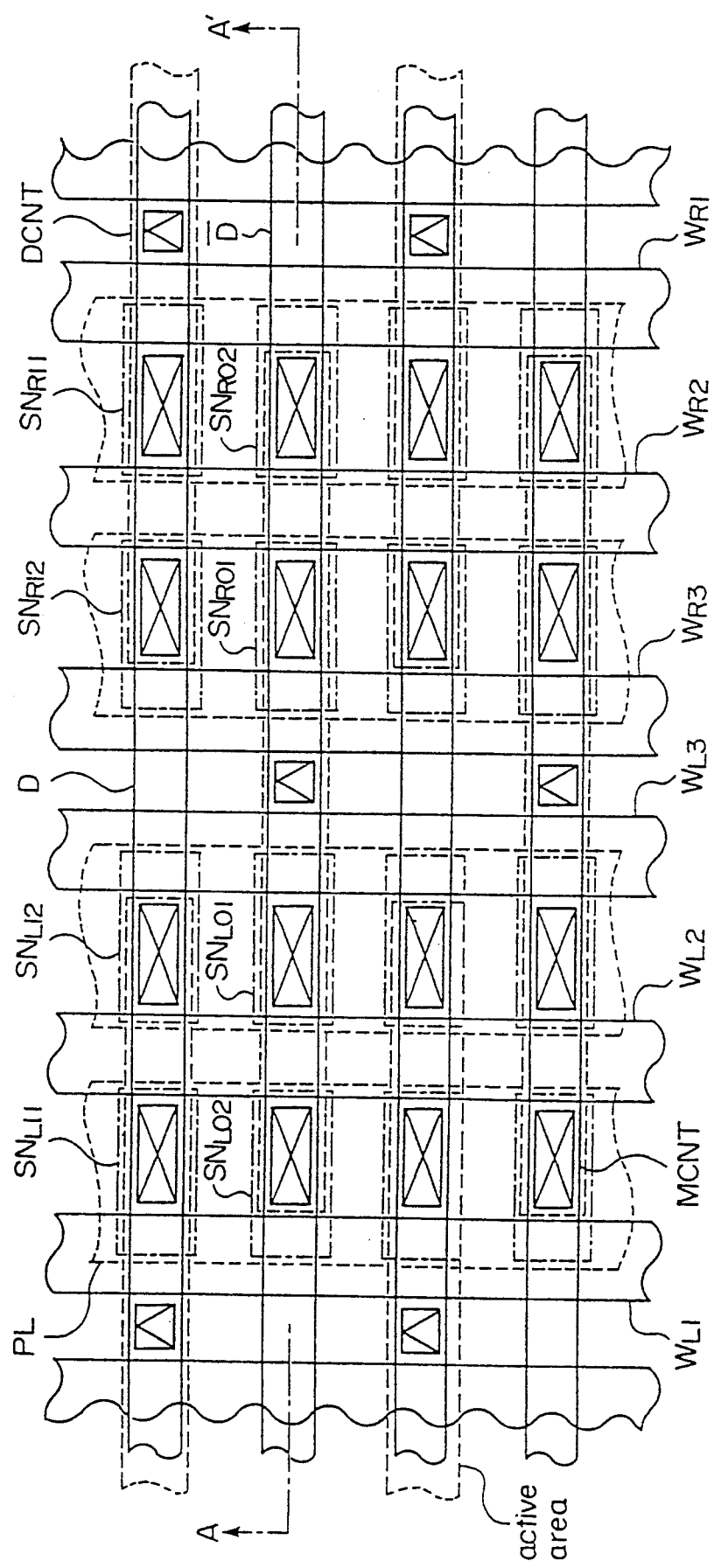
FIG. 20B is a plan view of the same arrangement of FIG. 19.

FIGS. 20A and 20B are respectively a cross sectional view and a plan view showing an example of the arrangement of the memory cell block MCB. The cross sectional view is taken on the line A—A' of the plan view.

In these figures, the reference symbol W ($W_{R1}$ etc.) designates the word-line, the reference symbol SN ($SN_{R01}$ etc.) designates the storage electrode, the reference symbol PL designates the plate electrode and the reference symbol D designates the data-line. These elements are constructed by the same manufacturing process and are made of the same materials as those in the structure shown in FIG. 12.

Figure 21A:
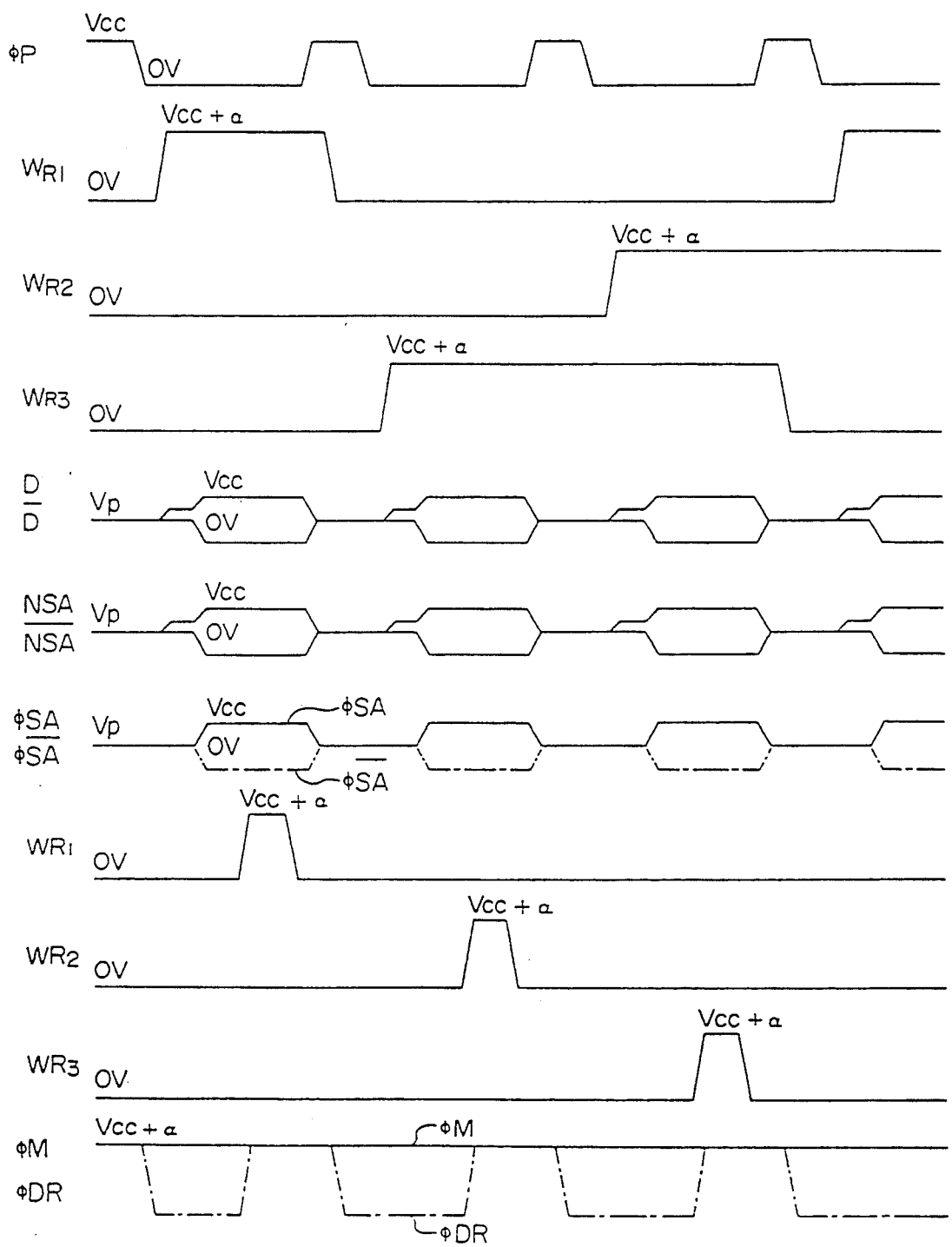
FIG. 21A is a waveform diagram showing operation of the same circuit of FIG. 19 in reading out data.

The description will hereinbelow be given with respect to the reading operation on referring to the operation waveforms of FIG. 21A. In this case, the description will be given with a specific case where the information is read out from a certain memory cell block $MCB_R$. Moreover, the description will be given with the case where the precharge voltage Vp of the data-line is set to Vcc/2 and the reading operation is performed by using that voltage as a reference voltage. First, the information is read out from the storage capacitor $C_{SR11}$. The signal $\phi P$ is reduced to 0V by making the pair of data-lines D and $\overline{D}$ across which the precharge voltage Vp are developed by the precharge circuit DC be in a floating state. Moreover, with the switch SWM being turned on, the switch SWR is turned off to electrically separate the stray capacitance of the register circuit DR from the differential amplifier SA. The word-line WR1 is raised to the high potential (Vcc+α) to turn the MOS transistor $M_{R11}$ on so that the electric charge accumulated in the storage capacitor $CSR_{11}$ is read out to the data-line D. The waveforms of the pair of data-lines D and $\overline{D}$ in FIG. 21A show the case where the information stored in the storage capacitor $CSR_{11}$ in the form of electric charge is at the high potential. Subsequently, the signal $\phi SA$ is raised to Vcc and the signal $\overline{\phi SA}$ is reduced to 0V to operate the differential amplifier SA so that the signal voltage on the data-line D is sensed to be amplified. Then, the switch SWR is turned ON to raise the Selection-line $W_{R1}$ of the four-transistor memory cell $RC_1$ to (Vcc+α) to store the information in the four-transistor memory cell $RC_1$ and then the selection-line $W_{R1}$ is reduced to 0V. Then, after the signal $\phi SA$ and $\overline{\phi SA}$ are made to return to Vp and the signal $\phi P$ is raised to Vcc to precharge the pair of the data-lines D and $\overline{D}$ and the storage capacitor $C_{SR11}$ to the precharge voltage Vp, the word-line $W_{R1}$ is reduced to the low potential 0V to turn the MOS transistor $M_{R11}$ off. Next, the information is read out from the storage capacitor $C_{SR01}$ in similar manner. After the signal $\phi P$ is reduced to 0V to make the pair of data-lines D and $\overline{D}$ be in the floating state and the switch SWR is turned off, the word-line $W_{R3}$ is raised to the high potential (Vcc+α) to read out the electric charge accumulated in the storage capacitor $C_{SR01}$ to the data-line $\overline{D}$. Then, the differential amplifier SA is operated to amplify the signal voltage on the data-line $\overline{D}$ and the resultant information is stored in the four-transistor memory cell $RC_2$ in the register circuit DR. Then, the signals $\phi SA$ and $\overline{\phi SA}$ are made to return to Vp and the signal $\phi P$ is raised to Vcc to precharge the pair of data-lines D and $\overline{D}$ of the storage capacitor $C_{SR01}$ to the precharge voltage Vp. Thereafter, with the word-line $W_{R3}$ being at the high potential (Vcc+α), the word-line $W_{R2}$ is also raised to the high potential ($V_{cc}+\alpha$) to read out the electric charge accumulated in the storage capacitor $C_{SR02}$ to the data-line $\overline{D}$. At this time, the electric charge accumulated in the storage capacitor $C_{SR12}$ is re-distributed between the storage capacitors $C_{SR11}$ and $C_{SR12}$ to be held as it is. After the signal read out from the storage capacitors $C_{SR02}$ to the data line $\overline{D}$ is sensed by the differential amplifier SA to be stored in the 4 transistor memory cell $RC_3$, the pair of data-lines D and $\overline{D}$, and the storage capacitors $C_{SR01}$ and $C_{SR02}$ are precharged by the precharge circuit PC. Subsequently, the word-line $W_{R1}$ is also raised with the word line $W_{R3}$ being at the high potential (Vcc+α) to read out the electric charge accumulated in the storage capacitors $C_{SR11}$ and $C_{SR12}$ to the data-line D. The resultant signal is sensed to be amplified by the differential amplifier SA. Thus, all the information which is stored in the four storage capacitors $C_{SR}$ in the memory cell block $M_{CBk}$ is read out. Up to this time, with the information in the desired storage capacitor $Cs_R$ being amplified by the differential amplifier SA, the switch SWY is turned on thereby to output the information to the pair of input-output lines and $\overline{IO}$ in the form of a differential signal.

Figure 21B:
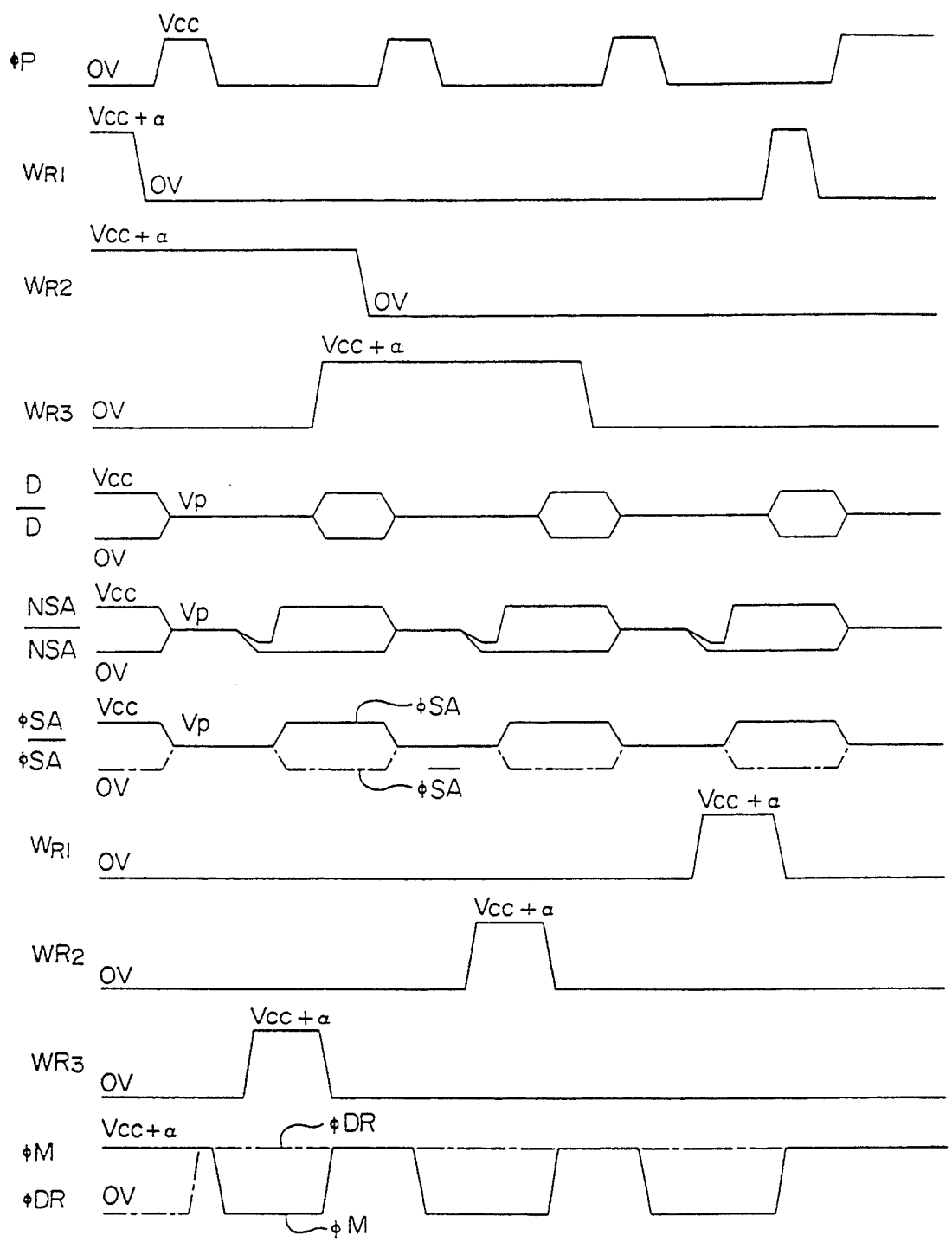
FIG. 21B is a waveform diagram showing operation of the circuit of FIG. 19 in restoring the data.

In accordance with the writing operation shown in FIG. 21B, the information which was read out from the memory cell block $MCB_R$ in a manner as described above is restored in the reverse order of the reading operation. First, in the state in which the signal read out from the storage capacitor $Cs_{R12}$ is amplified by the differential amplifier SA, the word-line $W_{R1}$ is reduced, so that the information read out from the storage capacitor $Cs_{R12}$ is stored in both the storage capacitors $Cs_{R12}$ and $Cs_{R11}$. After the pair of data-lines D and $\overline{D}$ are precharged, the switch SWM is turned OFF to electrically separate the capacitances of the pair of data-lines D and $\overline{D}$ from the differential amplifier SA. Thus, the selection-line $W_{R3}$ is raised to (Vcc+α) to read out the information stored in the four-transistor memory cell $RC_3$. The information thus read out is amplified by the differential amplifier SA. Thereafter, the switch SWM is turned on to store the amplified information in both the storage capacitors $Cs_{R02}$ and $Cs_{R01}$ and the wordline $W_{R2}$ is then reduced to 0V. Then, the pair of data-lines D and $\overline{D}$ and the storage capacitor $Cs_{R01}$ are again precharged, the switch SWM is turned off to read out the information which was read out from the storage capacitor $Cs_{R01}$ from the four-transistor memory cell $RC_2$ in the register circuit DR to be restored, and the wordline $W_{R3}$ is then reduced to 0V. Finally, the word-line $W_{R1}$ is selected so that the information stored in the four-transistor memory cell $RC_1$ in the register circuit DR is rewritten to the storage capacitor $Cs_{R11}$. Thus, the restore operation is completed.

The writing operation is performed in such a way that in the reading or restore operation, after the information of the desired storage capacitor is amplified by the differential amplifier SA, that information is restored. That is, the switch SWY is turned on to write the information from the externals of the chip which was written to the pair of input-output lines IO and $\overline{IO}$ to the differential amplifier SA, thus completing the writing operation.

The memory cell block MCB according to the present embodiment has the arrangement in which two of the one-transistor/one-capacitor type memory cells used in the prior art DRAM are connected in series to each other and the two memory cells are further combined therewith. As a result, the number of connection holes to the data-line is reduced one half. Thus, it is possible to decrease the area of the memory cell. Since with the one-transistor/one-capacitor type memory cell, the destructive reading is performed, the operations for the memory cell block MCB are performed in a time series manner, and the information is prevented from being erased by means of the register circuit. In addition, the folded data-line arrangement in which a high signal-to-noise ratio is obtained is applied to the present embodiment.

Figure 22:
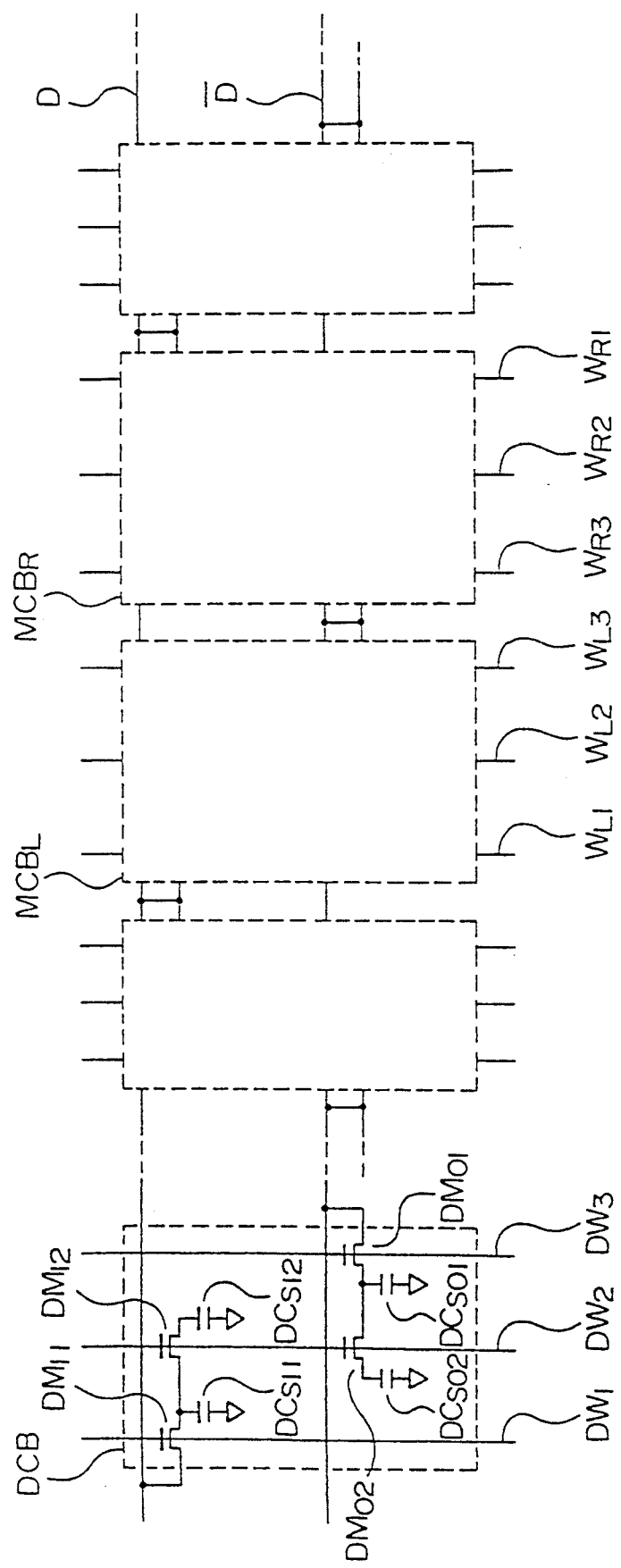
FIG. 22 is a circuit diagram showing an example of the arrangement of a dummy cell block of the invention.

FIG. 22 is a circuit diagram showing the arrangement of an example in which for the purpose of balancing the coupling noise to the pair of data-lines D and $\overline{D}$ or the word-line in the embodiment shown in FIG. 19, the dummy cell block DCB is connected to the pair of data-lines D and $\overline{D}$. The dummy cell block DCB has the same arrangement as that of the memory cell block MCBL, and the storage capacitors DCs (DCs$_{01}$, DCs$_{02}$, DCs$_{11}$, and DCs$_{12}$) have the same Capacitance value as that of the storage capacitor Cs$_L$ in the memory cell block MCB$_L$ and they are controlled by the dummy word-line DW (DW$_1$, DW$_2$, and DW$_3$). The present example has the same arrangement as that of FIG. 19 except that the dummy cell block DCB is connected. In the figure, the sense means SA, the register circuit DR and the line are omitted for brevity.

Let us assume that the precharge voltage Vp applied to the precharge circuit PC is Vcc/2. Then, in the stand-by state, the dummy word-lines DW (DW$_1$, DW$_2$, and DW$_3$) are raised to the high potential to turn the precharge circuit PC on to precharge the pair of data-lines D and $\overline{D}$, and the storage capacitor DCs of the dummy cell block DCB to Vcc/2. In the reading operation, after the dummy data-line DW is reduced to store Vcc/2 in the storage capacitor DCs, the pair of data-lines D and $\overline{D}$ are made to be in the floating state. The dummy word-line DW is driven in the reading operation in such a way that the dummy word-line DW$_3$ and the wordline W$_{R1}$ or W$_{L1}$, D$_{W2}$ and W$_{R2}$ or W$_{L2}$, and D$_{W1}$ and W$_{R3}$ or W$_{L3}$ are driven with the same signals, respectively. For example, when the memory cell block MCB$_R$ is selected, the MOS transistor M$_{R11}$ is turned on by the word-line W$_{R1}$ and at the same time the MOS transistor DM$_{01}$ in the dummy cell block DCB is turned on. Thus, even if the storage capacitor Cs in the memory cell block is connected in parallel with the stray capacitance of the data-line, the storage capacitor DCs in the dummy cell block having the same capacitance value as that of Cs is necessary connected to the data-line paired with that data-line. On the other hand, since in the restore operation of the memory cell block, there is no need of using the dummy cell block, with the dummy word-line DW being left being raised, the operation returns to the stand-by state.

Even if in the reading operation, the storage capacitor Cs in the memory cell block is connected in parallel with the stray capacitance of the data-line D by connecting the dummy cell block DCB, since the storage capacitor DCs of the dummy cell block having the same capacitance value as that of Cs is connected to the data-line D, the capacitance balance between the pair of data lines D and $\overline{D}$ is maintained. Moreover, by driving the word-line and the dummy data-line with the same signal, the noise generated from the word-line to the dummy data-line can be equalized between the pair of data-lines D and $\overline{D}$. As a result, it is possible to eliminate the possibility of the error of judgement with respect to the information in the differential amplifier SA.

FOURTEENTH EMBODIMENT

Figure 23:
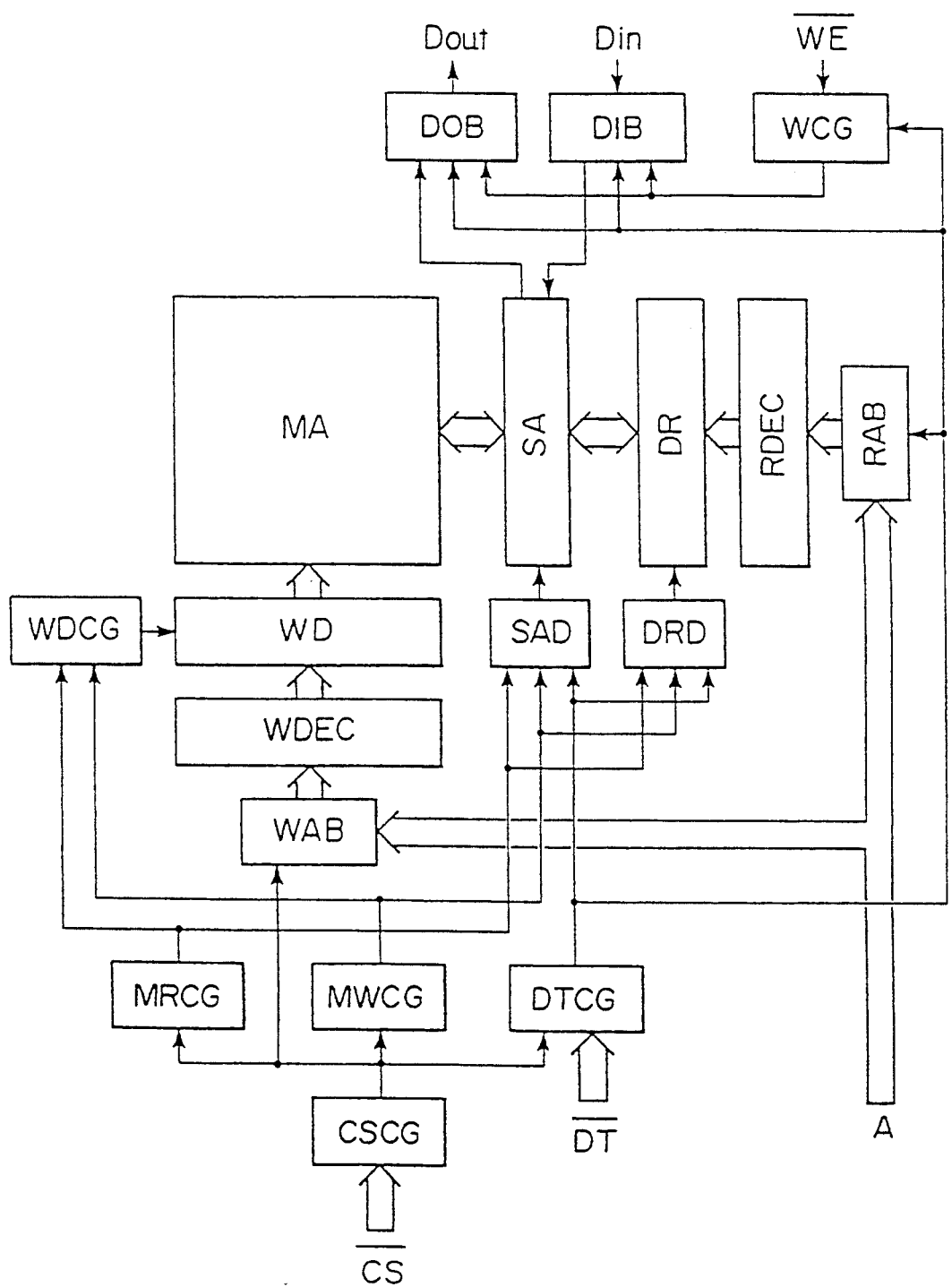
FIG. 23 is a block diagram showing the arrangement of a chip of the invention.

FIG. 23 is a block diagram showing the arrangement of main portions of the chip of the semiconductor memory device according to the present invention. In the figure, the reference symbol MA designates a memory array in which memory cell blocks for storing therein n bits are disposed in a matrix arrangement, the reference symbol SA designates sense means, and the reference symbol DR designates a register circuit. These elements are arranged in such a manner as in the embodiment shown in FIG. 15. Moreover, the reference symbol WD designates a word-driver for driving the word-lines connected to the associated memory cell blocks, WDCG a word series clock generator for controlling the drive timing for the word-line and the like, WDEC a decoder for decoding a word series address, WAB an address buffer for holding the word series address, SAD a driver for generating a control pulse for the sense means, DRD a driver for generating a control pulse for the register circuit, RDEC a decoder for decoding an address of the register circuit, RAB an address buffer for holding an address of the register circuit, DIB an input buffer for deciding information Din inputted from the external side, DOB an output buffer for deciding information outputted to the externals, CSCG a chip select series clock generator for controlling a timing for each portion, MRCG a reading series clock generator for controlling a timing for the reading from the memory cell block, MWCG a writing series clock generator for controlling a timing of the writing to the memory cell block, DTCG a data transfer clock generator for controlling a timing of the data transfer to or from the external side, and WCG a write clock generator for controlling the change-over between the data output to the external side and the data input therefrom. The means for discriminating the information of the register circuit DR may be provided so as to be separated from SA in some cases. Moreover, the register circuit DR may be directly connected to both the output buffer DOB and the input buffer DIB in some cases.

Figure 24A:
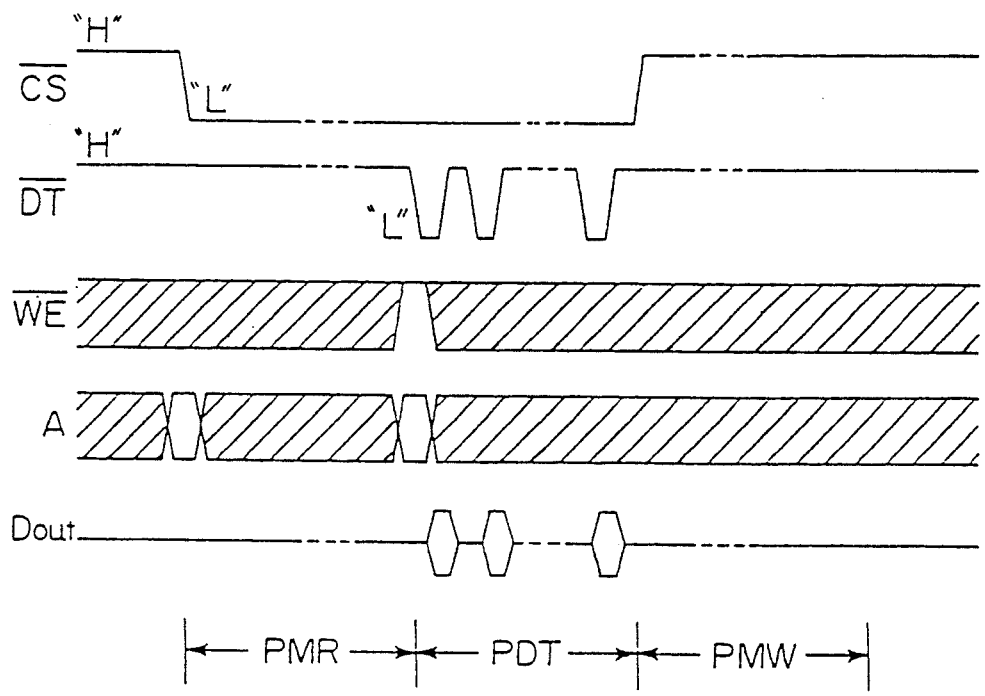
FIG. 24A is a waveform diagram showing operation of the chip arrangement of FIG. 23 in reading out data.

The operation will hereinbelow be described on referring to the signal waveforms of FIG. 24. FIGS. 24A, 24B and 24C are views showing the operation of reading out the data to the externals of the chip, the operation of writing the data from the externals of the chip, and the refresh operation, respectively. In these figures, the reference symbol PMR designates the reading period, the reference symbol PDT designates the data transfer period, and the reference symbol PMW designates the period of the writing to the memory cell block.

First, the description will be given with respect to the reading operation on referring to FIG. 25 24A. By the fall of the chip select signal $\overline{CS}$, the chip select series clock generator is operated to start the reading period PMR. The address A of plural bits which have been inputted at this time are written to the address buffer WAB and are then decoded by the decoder WDEC to be transferred to the word-line WD. Moreover, in accordance with the reading series clock generator MRCG, the word series clock generator WDCG, and the drivers SAD and DRD are operated. Then, the information is shifted from the memory array MA to the register circuit DR by means of the sense means SA. The operation during this period is such an operation as shown in FIG. 16A for example.

Subsequently, by the first fall of the data transfer signal $\overline{DT}$, the data transfer clock generator DTCG is operated to start the data transfer period PDT. The address A of plural bits which have been inputted at this time are written to the address buffer RAB and are then decoded by the decoder RDEC. Moreover, the write enable signal $\overline{WE}$ which is on the high level "H" is fetched to the write clock generator WCG to select the reading. In accordance with the data transfer clock generator DTCG, the drivers SAD and DRD are operated. Then, the information is shifted from the register circuit DR to the output buffer DOB by means of the sense means SA. The output buffer DOB is controlled by the data transfer clock generator DTCG so that the output data Dout are continuously outputted to the external side every fall of the data transfer signal $\overline{DT}$. The operation during this period is such an operation as shown in FIG. 16B for example.

Thereafter, by the rise of the chip select signal $\overline{CS}$, the chip select series clock generator is operated to start the writing period PMW. In accordance with the writing series clock generator MWCG, the word series clock generator WDCG, and the drivers SAD and DRD are operated. Then, the information is shifted from the register circuit DR to the memory array MA by means of the sense means. The operation during this period is such an operation as shown in FIG. 16C for example.

Figure 24B:
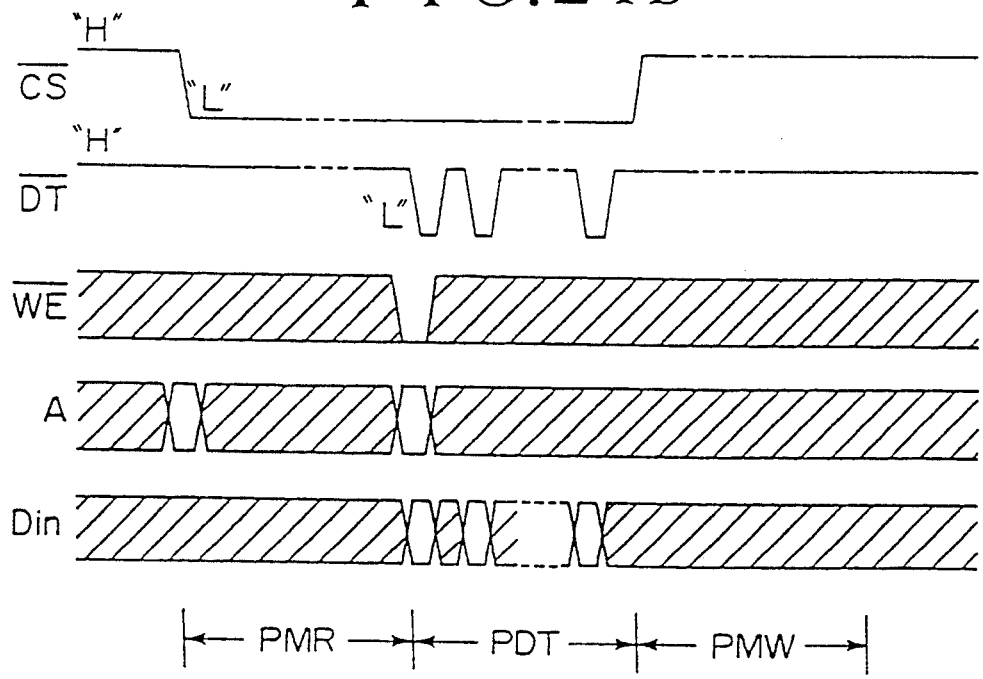
FIG. 24B is a waveform diagram showing operation of the same chip arrangement of FIG. 23 in refreshing the data.

In accordance with the operation timing shown in FIG. 24B, the writing operation is performed in the similar manner to that of the reading operation. That is, the writing operation is performed in the same manner as in the reading operation, with respect to the period PMR of the reading from the memory cell block and the period PMW of the writing thereto, except for the data transfer period PDT. At the time of the first fall of the data transfer signal $\overline{DT}$, the write enable signal $\overline{WE}$ which is on the low level "L" is fetched to the write clock generator WCG to select the writing. Moreover, the address A of plural bits which have been inputted at this time are fetched to the address buffer RAB and are then decoded by the decoder RDEC. The input data Din are continuously fetched to the input buffer DIB every fall of the data transfer signal DT by the data transfer clock generator DTCG. In accordance with the data transfer clock generator DTCG, the drivers SAD and DRD are operated so that the information is written from the input buffer DIB to the register circuit DR by mean of the sense means SA.

In this case, the address of the register circuit DR is inputted only when the data transfer signal $\overline{DT}$ is first fallen, so that the data of plural bits are transferred to or from the externals of the chip in sequence. Such an arrangement may be taken that whenever the data transfer signal $\overline{DT}$ is fallen, the address in the register circuit DR is fetched, and the information of that address is transferred to or from the external side. In this case, since there is no need of controlling the order of the data of plural bits, it is easy to control the data transfer. Incidentally, in the case where the address is fetched only when the data transfer signal $\overline{DT}$ is first fallen, the data transfer can be performed at a higher speed.

Figure 24C:
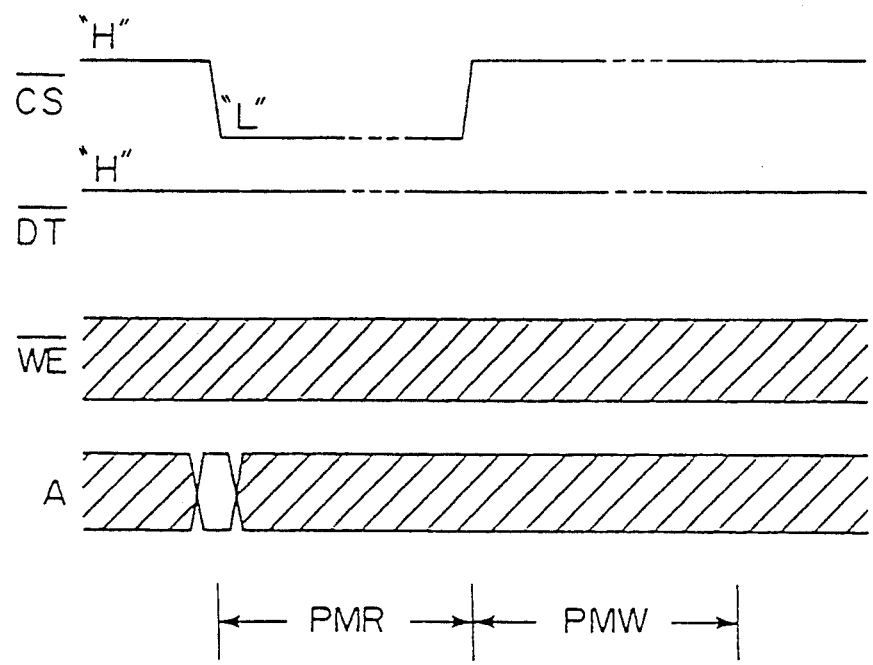
FIG. 24C is a waveform diagram showing operation of the same chip arrangement of FIG. 23 in storing the data.

As shown in FIG. 24C, the period PMR of the reading from the memory cell block and the period PMW of the writing thereto are continuously executed thereby to perform the refresh operation. The chip select signal $\overline{CS}$ is made to fall to start the period PMR of the reading from the memory cell block. While leaving the data transfer signal $\overline{DT}$ being on the high level "H", the chip select signal $\overline{CS}$ is made to rise to execute the period PMW of the writing to the memory cell block. The address of the memory cell block to be refreshed is fetched when making the chip select signal $\overline{CS}$ fall.

The address for the refresh operation may not be inputted from the external side but be generated inside the chip. Moreover, the refresh may not be controlled from the externals but be automatically controlled in the internal side of the chip. With such an operation, while the control from the externals is easy, the access time becomes long since the reading or writing operation and the refresh operation compete with each other. In such a case, if the signal for representing the completion of the period PMR of the reading from the memory cell block is outputted to the external side of the chip and in response to that signal, the data transfer signal $\overline{DT}$ is made to fall, it is possible to shorten the mean access time.

In this arrangement, by using the data transfer signal $\overline{DT}$, the signal of plural bits is continuously transferred to or from the externals of the chip. The data transfer is performed by accessing to the register circuit DR without accessing to the memory array MA. Therefore, it is possible to realize a high transfer rate. As for the application suitable for such a semiconductor memory device, for example, there is an external memory in the computer system. Hitherto, as for an external memory, there has been used a magnetic memory such as a hard disc. However, by using the semiconductor memory device of the present embodiment, it is possible to realize the miniaturization and the high speed operation. In this case, as for the controller for the semiconductor memory device, it is possible to use a semiconductor memory controller disclosed in Japanese Patent Application (un-examined publication number) JP-A 63-127486 or JP-A 63-113653.

FIFTEENTH EMBODIMENT

Figure 25:
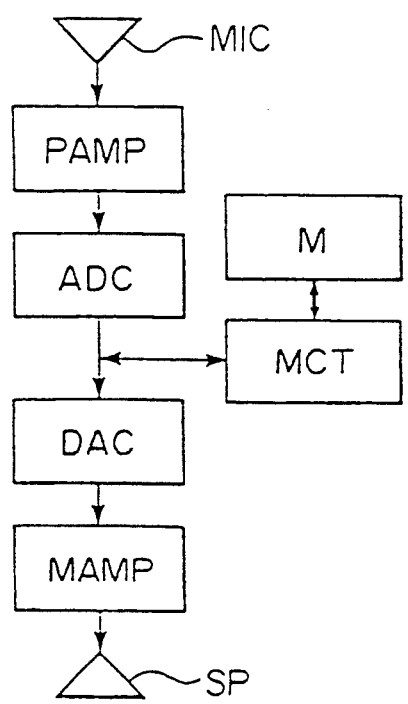
FIG. 25 is a block diagram showing an example in which the present invention is applied to a sound recording-reproducing apparatus.

FIG. 25 is a block diagram showing the arrangement of an applied example of the semiconductor memory device according to the present invention in which a sound recording-reproducing apparatus is arranged. In the figure, the reference symbol MIC designates a microphone as voice input means, the reference symbol SP designates a speaker as voice output means. The reference symbols PAMP and MAMP designate amplifiers, ADC an analog-to-digital converter, DAC a digital-to-analog converter, M a semiconductor memory device according to the present invention, and MCT a control circuit for controlling the semiconductor memory device M. In the figure, a low-pass filter for the pass band limitation, a low-pass filter for the waveform shaping and the like are omitted for brevity.

The sound recording operation is performed in such a way that the voice applied to the microphone MIC is amplified by the amplifier PAMP, and the resultant analog signal is converted into a digital signal by the analog-to-digital converter ADC and is then controlled to be written to the semiconductor memory device M by the controller MCT. At this time, the address, the clock signal and the like of the semiconductor memory device M are generated by the controller MCT. On the other hand, the reproducing operation is performed in such a way that the semiconductor memory device is controlled to read out the information stored therein b
y the controller MCT, and the information thus read is converted into an analog signal by the digital-toanalog converter DAC, amplified by the amplifier MAMP and is outputted from the speaker SP.

Let us consider a specific case where with the semiconductor memory device, the input-output operation is performed one bit by one bit. In this case, when the information of plural bits is outputted in parallel from the analog-to-digital converter ADC, such a procedure may be taken that by providing a parallel-to-serial converter, that information is converted into information of time series type to be transferred to the semiconductor memory device M. Moreover, when the digital-to-analog converter ADC is arranged in such a way that the information of plural bits is inputted thereto in parallel, such a procedure may be taken that by providing a serial-to-parallel converter, the output of the semiconductor memory device M is converted into information of parallel type.

The data rate of the voice information may be 64 kbit/sec, so that the provision of the semiconductor memory device having a cycle time of 15 μs can cope therewith. Moreover, the information is data which are continuous in a time series manner. Therefore, with the semiconductor memory device used for the voice recording apparatus, the operation speed does not become a problem, but an inexpensive and large capacity one is required. The semiconductor memory device according to the present invention is suitable for a high signal-to-noise ratio and high integration. Thus, it is possible to decrease the chip area to reduce a bit unit price. Therefore, for such an application, the semiconductor memory device is more suitable than the prior art DRAM.

As apparent from the above-mentioned embodiments, in the present invention, a plurality of memory cells each of which is made up of a switch and storage means are connected in a cascade manner to construct the memory cell blocks, and the memory cell blocks are used to construct the memory cell array, whereby it is possible to reduce the number of contacts between the data-lines and the memory cells. As a result, it is possible to reduce the occupation area of the connection hole and to reduce the chip area. Moreover, the stray capacitance of the data-line becomes small. Thus, it is possible to realize the reading operation at a high signal-to-noise ratio.

What is claimed is:

1. A semiconductor memory device including:
a plurality of word lines;
a plurality of switches each of which is controlled by a corresponding one of said plurality of word lines; and
a plurality of information storage means each of which is coupled between a corresponding one of said plurality of switches and a reference potential,
wherein a memory cell block includes a plurality of memory cells each of which comprises a corresponding one of said plurality of information storage means, a corresponding one of said plurality of switches and a corresponding one of said plurality of word lines, and
wherein said plurality of switches of said plurality of memory cells are so connected in series that the information storage means of one of said plurality of memory cells is coupled between the switch of said one memory cell and the switch of the adjacent memory cell, wherein information of said information storage means of said one memory cell is read out on a signal terminal through said switch of said one memory cell and said switch of said adjacent memory cell, and wherein information is written into said information storage means of said one memory cell through said signal terminal, said switch of said adjacent memory cell and said switch of said one memory cell.

2. A semiconductor memory device according to claim 1, wherein said memory device includes a data-line coupled to said signal terminal, and wherein a plurality of said memory cell blocks are connected to said data-line.

3. A semiconductor memory device according to claim 2, wherein said plurality of memory cell blocks are connected to the data-line through signal transfer means, and wherein said signal transfer means transfers a signal in the reading operation in a state in which an input impedance from said memory cell blocks is high.

4. A semiconductor memory device according to claim 2, including therein a plurality of said data-lines to each of which said plurality of memory cell blocks are connected.

5. A semiconductor memory device according to claim 4, wherein said memory device includes a global data-line, and wherein said plurality of data-lines are connected to said global data-line through said signal transfer means.

6. A semiconductor memory device according to claim 5, including therein the plurality of global data-lines to each of which said plurality of data-lines is connected.

7. A semiconductor memory device according to claim 5, wherein said signal transfer means transfers a signal in the reading operation in a state in which an input impedance from said data-line is high, and acts as connection means in the writing operation.

8. A semiconductor memory device according to claim 2, wherein sense means for sensing a signal read out from said memory cell block is provided and said sense means is connected to said data-lines.

9. A semiconductor memory device according to claim 5, wherein sense means for sensing a signal read out from said memory cell block is provided and said sense means is connected to said global data-line.

10. A semiconductor memory device according to claim 8, including therein a register circuit for temporarily storing therein information sensed by said sense means.

11. A semiconductor memory device according to claim 10, wherein a storage capacity of said register circuit is substantially equal to a storage capacity of said memory cell block.

12. A semiconductor memory device according to claim 10, wherein a storage capacity of said register circuit is smaller than a storage capacity of said memory cell block by one storage means.

13. A semiconductor memory device according to claim 8, wherein the reading and writing operation is performed in such a way that information read out from a certain memory cell block is sensed by said sense means, and the sensed result is written to other memory cell block connected to the same data-line as that of said certain memory cell block.

14. A semiconductor memory device according to claim 13, wherein the number of memory cell blocks provided in said data-line is more than the number required for the storage capacity of said device by one per data-line.

15. A semiconductor memory device according to claim 13, comprising means for storing a correspondence relationship between said plurality of memory cell blocks and an address inputted from the external side of said device, and means for selecting a memory cell block in accordance with the correspondence relationship therebetween.

16. A semiconductor memory device according to claim 8, wherein said data-line is paired with another data-line, and differential signal sense means is connected to said pair of data-lines and sensing differential between signals of said paired data-lines.

17. A semiconductor memory device according to claim 9, wherein said global data-line is paired with another global data-line, and differential signal sense means is connected to said pair of global data-lines and sensing differential between signals of said data-lines.

18. A semiconductor memory device according to claim 4, including therein a dummy data-line provided in common in said plurality of data-lines,
a plurality of signal converting means connected to said plurality of data-lines and said dummy data-line, respectively, and a plurality of differential signal sense means provided corresponding to the signal converting means provided in said plurality of data-lines,
wherein an output of the signal converting means provided in each of said data-lines, and an output of the signal converting means provided in said dummy data-line are inputted to each of said differential signal sense means.

19. A semiconductor memory device according to claim 18, wherein said signal converting means is made up of signal transfer means comprised of a voltage-to-current converter cooperating with a load circuit acting as a current-to-voltage converter.

20. A semiconductor memory device according to claim 6, including therein a plurality of differential signal sense means provided in said plurality of global data-lines, and a global dummy data-line provided in common in said plurality of global data-lines, to which a plurality of dummy data-lines are connected by signal transfer means which is capable of being selected by a control signal,
wherein each of said global data-lines and said global dummy data-line are connected to differential signal means provided in each of said global data-lines.

21. A semiconductor memory device according to claim 18, wherein a dummy cell block having the same arrangement as that of said memory cell block is connected to said dummy data-line.

22. A semiconductor memory device according to claim 21, wherein the number of dummy cell blocks connected to said dummy data-line is equal to the number of memory cell blocks connected to each of said data-lines, and said memory cell blocks and said dummy cell blocks are connected to the respective word-lines to which the same signal is applied.

23. A semiconductor memory device according to claim 4, wherein said signal converting means is provided in common in said plurality of data-lines and said plurality of dummy data-lines, and switch means is provided for connecting said signal converting means and each of said plurality of data-lines and said plurality of dummy data-lines to each other.

24. A semiconductor memory device according to claim 5, wherein said signal transfer means is provided in common in said plurality of data-lines and said plurality of dummy data-lines, and switch means is provided for connecting said signal transfer means and each of said plurality of data-lines and said plurality of dummy data-lines to each other.

25. A semiconductor memory device according to claim 1, wherein said memory cell block is arranged in such a way that one switch is constructed by one transistor and one storage means is constructed by one capacitor.

26. A semiconductor memory device according to claim 25, wherein said memory cell block is arranged by connecting a plurality of transistors in series in such a way that an impurity-doped region is shared between two transistors.

27. A semiconductor memory device according to claim 25, wherein said capacitor is made up of an electrode which is in contact with one impurity-doped region of said transistor and extends over said transistor and data-line, an insulating film provided on said electrode, and a conductive electrode provided on said insulating film.

28. A semiconductor memory device according to claim 25, wherein the number of storage means connected to said data-lines is six per connection hole of said data-lines.

29. A semiconductor memory device according to claim 25, wherein the number of storage means connected to said data-lines is four per connection hole of said data-lines.

30. A semiconductor memory device according to claim 25, wherein the number of storage means connected to said data-lines is two per connection hole of said data-lines.

31. A semiconductor memory device according to claim 1, wherein signal transfer of said device with external elements outside said semiconductor memory device is performed by a data transfer signal.

32. A semiconductor memory device according to claim 1 comprising a composing element used with a sound recording-reproducing apparatus comprising:
voice input means for receiving and transmitting voice to an output signal;
a first amplifier for amplifying an output signal from said voice input means and providing an output signal;
an analog-to-digital converter for receiving and converting said output signal from said first amplifier to digital form and providing an output signal;
a semiconductor memory for receiving and storing said output signal from said analog-to-digital converter and supplying an output signal;
a digital-to-analog converter for being supplied with and converting said output signal from said semiconductor memory to analog signal and providing an output signal;
a second amplifier for amplifying said output signal from said digital-to-analog converter and providing an output signal; and
voice output means receiving said output signal from said second amplifier and outputting voice.

33. A semiconductor memory device including:
a plurality of word-lines;
a plurality of switches selected by said word-lines; and
a plurality of information storage means being controlled of signal transfer by said switches,
wherein a memory cell block is connected by connecting at least two memory cells each of which comprises said switch and said information storage means, in such a way that the switches are connected in series, and a signal of information storage means of a certain memory cell is read out through a switch of another memory cell in said memory cell block;

wherein said memory device includes a data-line, and a plurality of said memory cell blocks are connected to said data-lines;

wherein sense means for sensing a signal read out from said memory cell block is provided and said sense means is connected to said data-lines, and wherein said semiconductor memory device includes a register circuit for temporarily storing therein information sensed by said sense means.

34. A semiconductor memory device including:
a plurality of word-lines;
a plurality of switches selected by said word-lines; and
a plurality of information storage means being controlled of signal transfer by said switches, wherein a memory cell block is connected by connecting at least two memory cells each of which comprises said switch and said information storage means, in such a way that the switches are connected in series, and a signal of information storage means of a certain memory cell is read out through a switch of another memory cell in said memory cell block;

wherein said memory device includes a data-line, and a plurality of said memory cell blocks are connected to said data-lines;

wherein sense means for sensing a signal read out from said memory cell block is provided and said sense means is connected to said data-lines; and wherein the reading and writing operation is performed in such a way that information read out from a certain memory cell block is sensed by said sense means, and the sensed result is written to other memory cell block connected to the same data-line as that of said certain memory cell block.

35. A semiconductor memory device according to claim 34, wherein the number of memory cell blocks provided in said data-line is more than the number required for the storage capacity of said device by one data-line.

36. A semiconductor memory device according to claim 34, comprising means for storing a correspondence relationship between said plurality of memory cell blocks and an address inputted from the external side of said device, and means for selecting a memory cell block in accordance with the correspondence relationship therebetween.

37. A semiconductor memory device including:
a plurality of word-lines;
a plurality of switches selected by said word-lines; and
a plurality of information storage means being controlled of signal transfer by said switches, wherein a memory cell block is connected by connecting at least two memory cells each of which comprises said switch and said information storage means, in such a way that the switches are connected in series, and a signal of information storage means of a certain memory cell is read out through a switch of another memory cell in said memory cell block;

wherein said memory device includes a data-line, and a plurality of said memory cell blocks are connected to said data-lines;

wherein said plurality of memory cell blocks are connected to the data-line through signal transfer means, and said signal transfer means transfers a signal in the reading operation in a state in which an input impedance from said memory cell blocks is high;

including therein a plurality of said data-lines to each of which said plurality of memory cell blocks are connected;

including therein a dummy data-line provided in common in said plurality of data-lines, a plurality of signal converting means connected to said plurality of data-lines and said dummy data-line, respectively, and a plurality of differential signal sense means provided corresponding to the signal converting means provided in said plurality of data-lines, wherein an output of the signal converting means provided in each of said data-lines, and an output of the signal converting means provided in said dummy data-line are inputted to each of said differential signal sense means.

38. A semiconductor memory device according to claim 37, wherein said signal converting means is made up of signal transfer means comprised of a voltage-to-current converter cooperating with a load circuit acting as a current-to-voltage converter.

39. A semiconductor memory device according to claim 38, wherein a dummy cell block having the same arrangement as that of said memory cell block is connected to said dummy data-lines.

40. A semiconductor memory device according to claim 39, wherein the number of dummy cell blocks connected to said dummy data-line is equal to the number of memory cell blocks connected to each of said data-lines, and said memory cell blocks and said dummy cell blocks are connected to the respective word-lines to which the same signal is applied.

41. A semiconductor memory device including:
a plurality of word-lines;
a plurality of switches selected by said word-lines, and
a plurality of information storage means being controlled of signal transfer by said switches, wherein a memory cell block is connected by connecting at least two memory cells each of which comprises said switch and said information storage means, in such a way that the switches are connected in series, and a signal of information storage means of a certain memory cell is read out through a switch of another memory cell in said memory cell block;

wherein said memory device includes a data-line, and a plurality of said memory blocks are connected to said data-lines;

wherein said plurality of memory cell blocks are connected to the data-line through signal transfer means, and said signal transfer means transfers a signal in the reading operation in a state in which an input impedance from said memory cell blocks is high;

including therein a plurality of said data-lines to each of which said plurality of memory cell blocks are connected;

wherein said signal converting means is provided in common in said plurality of data-lines and a plurality of dummy data-lines, and switch means is provided for connecting said signal converting means and each of said plurality of data-lines and said plurality of dummy data-lines to each other.

42. A semiconductor memory device including:

a plurality of word-lines;

a plurality of switches selected by said word-lines; and a plurality of information storage means being controlled of signal transfer by said switches, wherein a memory cell block is connected by connecting at least two memory cells each of which comprises a corresponding one of said plurality of information storage means, a corresponding one of said plurality of switches and a corresponding one of said plurality of word lines, in such a way that the switches are connected in series, and a signal of information storage means of a certain memory cell is read out through a switch of another memory cell in said memory cell block;

wherein said capacitor is made up of an electrode which is in contact with one impurity-doped region of said transistor and extends over said transistor and data-line, an insulating film provided on said electrode, and a conductive electrode provided on said insulating film.

* * * * *